(12) United States Patent
Suzuki

(10) Patent No.: US 11,032,497 B2
(45) Date of Patent: *Jun. 8, 2021

(54) SOLID STATE IMAGING DEVICE, METHOD OF MANUFACTURING SOLID-STATE IMAGING DEVICE, AND ELECTRONIC APPARATUS

(71) Applicant: SONY CORPORATION, Tokyo (JP)

(72) Inventor: Ryoji Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/864,811

(22) Filed: May 1, 2020

(65) Prior Publication Data

US 2020/0335535 A1 Oct. 22, 2020

Related U.S. Application Data

(63) Continuation of application No. 16/415,501, filed on May 17, 2019, now Pat. No. 10,651,223, which is a (Continued)

(30) Foreign Application Priority Data

Jul. 30, 2012 (JP) .................................. 2012-168365

(51) Int. Cl.
    *H04N 5/359* (2011.01)
    *H01L 27/146* (2006.01)
    *H04N 9/04* (2006.01)

(52) U.S. Cl.
    CPC ......... *H04N 5/359* (2013.01); *H01L 27/1463* (2013.01); *H01L 27/1464* (2013.01);
(Continued)

(58) Field of Classification Search
    CPC ........... H01L 27/1463; H01L 27/14627; H01L 27/14625; H01L 27/14621; H01L 27/1464; H04N 5/359; H04N 9/045
See application file for complete search history.

(56) References Cited

U.S. PATENT DOCUMENTS 10,651,223 B2 * 5/2020 Suzuki ................ H01L 27/1464

FOREIGN PATENT DOCUMENTS

JP 2010067827 A * 3/2010 ....... H01L 27/14632

OTHER PUBLICATIONS

JP 2010067827 Machine Translation (Year: 2010).*

* cited by examiner

*Primary Examiner* — Twyler L Haskins
*Assistant Examiner* — Angel L Garces-Rivera
(74) *Attorney, Agent, or Firm* — Sheridan Ross P.C.

(57) ABSTRACT

The present technique aims to provide a solid-state imaging device that reduces shading and color mixing between pixels. The present invention also provides a method of manufacturing the solid-state imaging device. The present technique further relates to a solid-state imaging device that enables provision of an electronic apparatus that uses the solid-state imaging device, a method of manufacturing the solid-state imaging device, and an electronic apparatus.

The solid-state imaging device includes a substrate, pixels each including a photoelectric conversion unit formed in the substrate, and a color filter layer formed on the light incidence surface side of the substrate. The solid-state imaging device also includes a device isolating portion that is formed to divide the color filter layer and the substrate for the respective pixels, and has a lower refractive index than the refractive indexes of the color filter layer and the substrate.

18 Claims, 16 Drawing Sheets

Related U.S. Application Data continuation of application No. 16/218,402, filed on Dec. 12, 2018, now Pat. No. 10,593,720, which is a continuation of application No. 15/720,134, filed on Sep. 29, 2017, now Pat. No. 10,319,770, which is a continuation of application No. 15/261,450, filed on Sep. 9, 2016, now Pat. No. 9,812,485, which is a continuation of application No. 14/417,027, filed as application No. PCT/JP2013/069509 on Jul. 18, 2013, now Pat. No. 9,496,303.

(52) U.S. Cl.
CPC .. *H01L 27/14621* (2013.01); *H01L 27/14625* (2013.01); *H01L 27/14627* (2013.01); *H04N 9/045* (2013.01)

SOLID STATE IMAGING DEVICE, METHOD OF MANUFACTURING SOLID-STATE IMAGING DEVICE, AND ELECTRONIC APPARATUS

This application is a continuation of U.S. patent application Ser. No. 16/415,501 filed May 17, 2019 now assigned U.S. Pat. No. 10,651,223 which is a continuation of U.S. patent application Ser. No. 16/218,402, filed Dec. 12, 2018, now U.S. Pat. No. 10,593,720 which is a continuation of U.S. patent application Ser. No. 15/720,134, filed Sep. 29, 2017, now U.S. Pat. No. 10,319,770 which is a continuation of U.S. patent application Ser. No. 15/261,450, filed Sep. 9, 2016, now U.S. Pat. No. 9,812,485, which is a continuation of U.S. patent application Ser. No. 14/417,027, filed Jan. 23, 2015, now U.S. Pat. No. 9,496,303, which is a national stage application under 35 U.S.C. 371 and claims the benefit of PCT Application No. PCT/JP2013/069509 having an international filing date of Jul. 18, 2013, which designated the United States, which PCT application claimed the benefit of Japanese Patent Application No. 2012-168365 filed Jul. 30, 2012, the disclosures of the above-identified applications are incorporated herein by reference.

TECHNICAL FIELD

The present technique relates to solid-state imaging devices, methods of manufacturing solid-state imaging devices, and electronic apparatuses, and more particularly, to a solid-state imaging device of a back-illuminated type, a method of manufacturing the solid-state imaging device, and an electronic apparatus using the solid-state imaging device.

BACKGROUND ART

In a conventional solid-state imaging device, light-gathering on-chip lenses corresponding to respective pixels are provided on the light receiving surface side of a substrate. Light that is gathered by the on-chip lenses enters the light receiving units of the respective pixels formed in the substrate, and signal charges in accordance with the amounts of light are generated at the light receiving units.

The tilt of a principal ray that enters the solid-state imaging device via an imaging optical system provided in an imaging apparatus or the like becomes greater in the periphery of the pixel region. Therefore, at the pixels in the periphery of the pixel region formed in the solid-state imaging device, light gathered by the corresponding on-chip lenses does not enter the central portions of the light receiving units.

To counter this problem, Patent Document 1 discloses a technique by which the pitch of the on-chip lenses corresponding to the light receiving units of the respective pixels becomes narrower toward the periphery of the pixel region, compared with the pitch of the light receiving units. With this arrangement, shading correction is performed. As the pitch of the on-chip lenses is made to differ between the central region of the pixel region and the periphery of the pixel region, light that enters obliquely can be gathered into the central portion of each light receiving unit in the periphery of the pixel region.

Meanwhile, so as to improve photoelectric conversion efficiency and sensitivity to incident light, a solid-state imaging device of a so-called back-illuminated type has been recently suggested. In a solid-state imaging device of a back-illuminated type, a drive circuit is formed on the surface side of a semiconductor substrate, and the back surface of the semiconductor substrate serves as the light receiving surface. As an interconnect layer is provided on the opposite side of the substrate from the light receiving surface in the solid-state imaging device of the back-illuminated type, the distance between the light receiving units formed in the substrate and the surfaces of the on-chip lenses provided on the light incidence side of the substrate becomes shorter, and accordingly, sensitivity is increased.

Patent Document 2 discloses a solid-state imaging device of a back-illuminated type in which a trench is formed to a predetermined depth from the light receiving surface (back surface) of the substrate so as to reduce color mixing, and photodiode regions are isolated from one another by burying an insulating material in the trench. As the respective photodiode regions are isolated from one another by the insulating material buried in the trench, electrons generated in a photodiode region do not leak into an adjacent photodiode region, and color mixing can be reduced.

CITATION LIST

Patent Document

Patent Document 1: JP 01-213079 A
Patent Document 2: JP 2010-225818 A

SUMMARY OF THE INVENTION

Problems to be Solved by the Invention

In a solid-state imaging device of a back-illuminated type, color filters are normally formed on the light receiving surface side of the substrate, and on-chip lenses are formed on the color filters, as in a solid-state imaging device of a front-illuminated type. In a solid-state imaging device of a back-illuminated type, the distance from the surfaces of the on-chip lenses to the light receiving surface of the substrate is shorter than that in a solid-state imaging device of a front-illuminated type, and accordingly, sensitivity is increased as described above. However, in the periphery of the pixel region in a solid-state imaging device of a back-illuminated type, shading due to oblique incident light might occur, or color mixing might be caused due to oblique light entering an adjacent pixel between color filters.

In view of the above aspects, the present disclosure aims to provide a solid-state imaging device that reduces shading and color mixing between pixels. The present disclosure also aims to provide a method of manufacturing the solid-state imaging device, and an electronic apparatus using the solid-state imaging device.

Solutions to Problems

A solid-state imaging device of the present disclosure includes a substrate, pixels each including a photoelectric conversion unit formed in the substrate, and a color filter layer formed on the light incidence surface side of the substrate. The solid-state imaging device of the present disclosure also includes a device isolating portion that is formed to divide the color filter layer and the substrate for the respective pixels, and has a lower refractive index than the refractive indexes of the color filter layer and the substrate.

As the device isolating portion is formed in the color filter layer and the substrate in the solid-state imaging device of the present disclosure, adjacent pixels are optically and electrically isolated from one another. As the device isolating portion is designed to have a lower refractive index than the refractive indexes of the color filter layer and the substrate, oblique light is prevented from entering an adjacent pixel, and light that enters the device isolating portion is gathered into the photoelectric conversion units of the respective pixels.

A method of manufacturing a solid-state imaging device of the present disclosure includes: the step of forming photoelectric conversion units in a substrate, the photoelectric conversion units corresponding to respective pixels; and the step of forming a color filter layer on the light incidence surface side of the substrate. The method of manufacturing a solid-state imaging device of the present disclosure also includes the step of forming a device isolating portion in the region to divide the color filter layer and the substrate for the respective pixels, the device isolating portion having a lower refractive index than the refractive indexes of the color filter layer and the substrate, the device isolating portion being formed prior to or after the formation of the color filter layer.

By the method of manufacturing the solid-state imaging device of the present disclosure, the device isolating portion that isolates the respective pixels from one another is formed in the color filter layer and the substrate. Accordingly, adjacent pixels are optically and electrically isolated from one another. The device isolating portion is designed to have a lower refractive index than the refractive indexes of the color filter layer and the substrate. Accordingly, oblique light is prevented from entering an adjacent pixel.

An electronic apparatus of the present disclosure includes the above described solid-state imaging device and a signal processing circuit that processes an output signal that is output from the solid-state imaging device.

Effects of the Invention

According to the present disclosure, a solid-state imaging device that reduces shading and color mixing between adjacent pixels is obtained. With the use of this solid-state imaging device, an electronic apparatus with improved image quality can be obtained.

MODES FOR CARRYING OUT THE INVENTION

Figure 1:
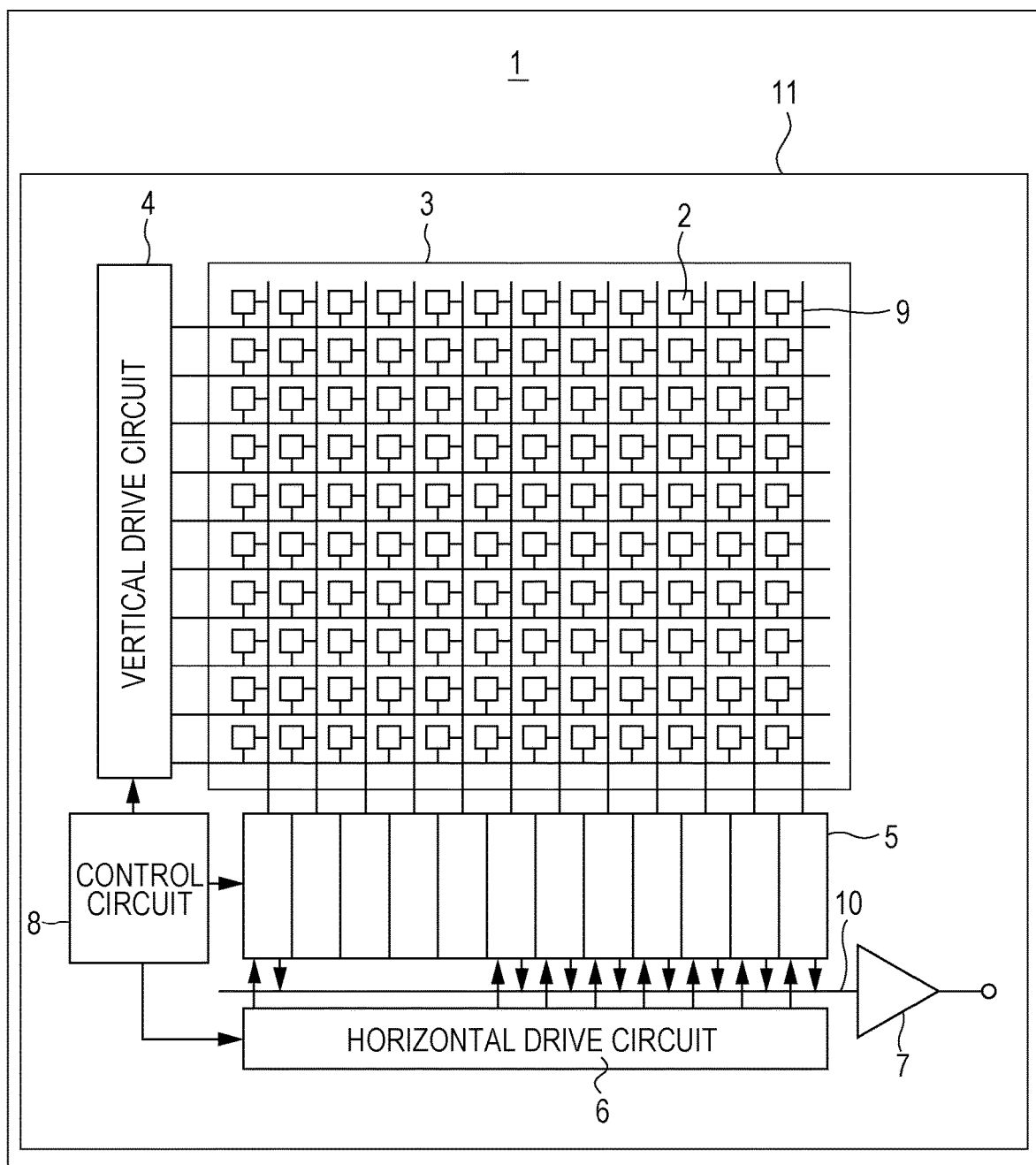
FIG. 1 is a schematic diagram showing an entire solid-state imaging device of a CMOS (Complementary Metal Oxide Semiconductor) type according to a first embodiment of the present disclosure.

The following is a description of solid-state imaging devices according to embodiments of the present disclosure, methods of manufacturing the solid-state imaging devices, and an example of an electronic apparatus, with reference to FIGS. 1 through 16. Embodiments of the present disclosure will be explained in the following order. However, the present disclosure is not limited to the examples described below.

1. First embodiment: a solid-state imaging device
1-1. Structure of the entire solid-state imaging device
1-2. Structures of main components
1-3. Manufacturing method
2. Second embodiment: an example where a pixel isolating portion is provided on a substrate
3. Third embodiment: a (first) example where a device isolating portion is hollow
3-1. Structures of main components
3-2. Manufacturing method
3-3. Modification
4. Fourth embodiment: a (second) example where a device isolating portion is hollow
5. Fifth embodiment: an example where the color filter layers are made thicker
6. Sixth embodiment: an example where a light scattering structure is provided
7. Seventh embodiment: an example where a light absorbing portion is provided
8. Eighth embodiment: a (first) example where high-refractive material portions are provided
9. Ninth embodiment: a (second) example where high-refractive material portions are provided 10. Tenth embodiment: an example where on-chip lenses are provided 11. Eleventh embodiment: an electronic apparatus

1. First Embodiment: Solid-State Imaging Device

1-1. Structure of the Entire Solid-State Imaging Device

First, a solid-state imaging device according to a first embodiment of the present disclosure is described. FIG. 1 is a schematic view of the entire structure of a CMOS solid-state imaging device according to the first embodiment of the present disclosure.

The solid-state imaging device 1 of this embodiment is designed to include a pixel region 3 formed with pixels 2 arranged on a substrate 11 made of silicon, a vertical drive circuit 4, column signal processing circuits 5, a horizontal drive circuit 6, an output circuit 7, and a control circuit 8.

As will be described later, the pixels 2 are designed to include photoelectric conversion units formed with photodiodes, and pixel transistors, and are regularly arranged in a two-dimensional array in the substrate 11. The pixel transistors forming the pixels 2 may be transfer transistors, reset transistors, select transistors, and amplifying transistors, for example.

The pixel region 3 is formed with the pixels 2 regularly arranged in a two-dimensional array. The pixel region 3 includes an effective pixel region that actually receives light, amplifies signal charges generated through photoelectric conversion, and reads out the signal charges to the column signal processing circuits 5, and a black reference pixel region (not shown) for outputting optical black that serves as the reference for black levels. The black reference pixel region is normally formed in the outer periphery of the effective pixel region.

Based on a vertical synchronization signal, a horizontal synchronization signal, and a master clock, the control circuit 8 generates a clock signal, a control signal, and the like that serve as the references for operation of the vertical drive circuit 4, the column signal processing circuits 5, the horizontal drive circuit 6, and the like. The clock signal, the control signal, and the like generated by the control circuit 8 are input to the vertical drive circuit 4, the column signal processing circuits 5, the horizontal drive circuit 6, and the like.

The vertical drive circuit 4 is formed with a shift register, for example, and selectively scans the respective pixels 2 in the pixel region 3 sequentially in the vertical direction by the row. Pixel signals that are based on the signal charges generated in accordance with the amounts of light received by the photodiodes of the respective pixels 2 are then supplied to the column signal processing circuits 5 through vertical signal lines 9.

The column signal processing circuits 5 are provided for the respective columns of the pixels 2, for example, and each of the column signal processing circuits 5 performs signal processing such as denoising and signal amplification through correlated double sampling to calculate a difference between a reset level and a signal level in each corresponding pixel column, on the signal output from the pixels 2 of each corresponding row. Horizontal select switches (not shown) are provided between the output stages of the column signal processing circuits 5 and a horizontal signal line 10.

The horizontal drive circuit 6 is formed with a shift register, for example, sequentially selects the respective column signal processing circuits 5 by sequentially outputting horizontal scan pulses, and causes the respective column signal processing circuits 5 to output pixel signals to the horizontal signal line 10.

The output circuit 7 performs signal processing on signals sequentially supplied from the respective column signal processing circuits 5 through the horizontal signal line 10, and outputs the processed signals.

1-2. Structures of Main Components

Figure 2:
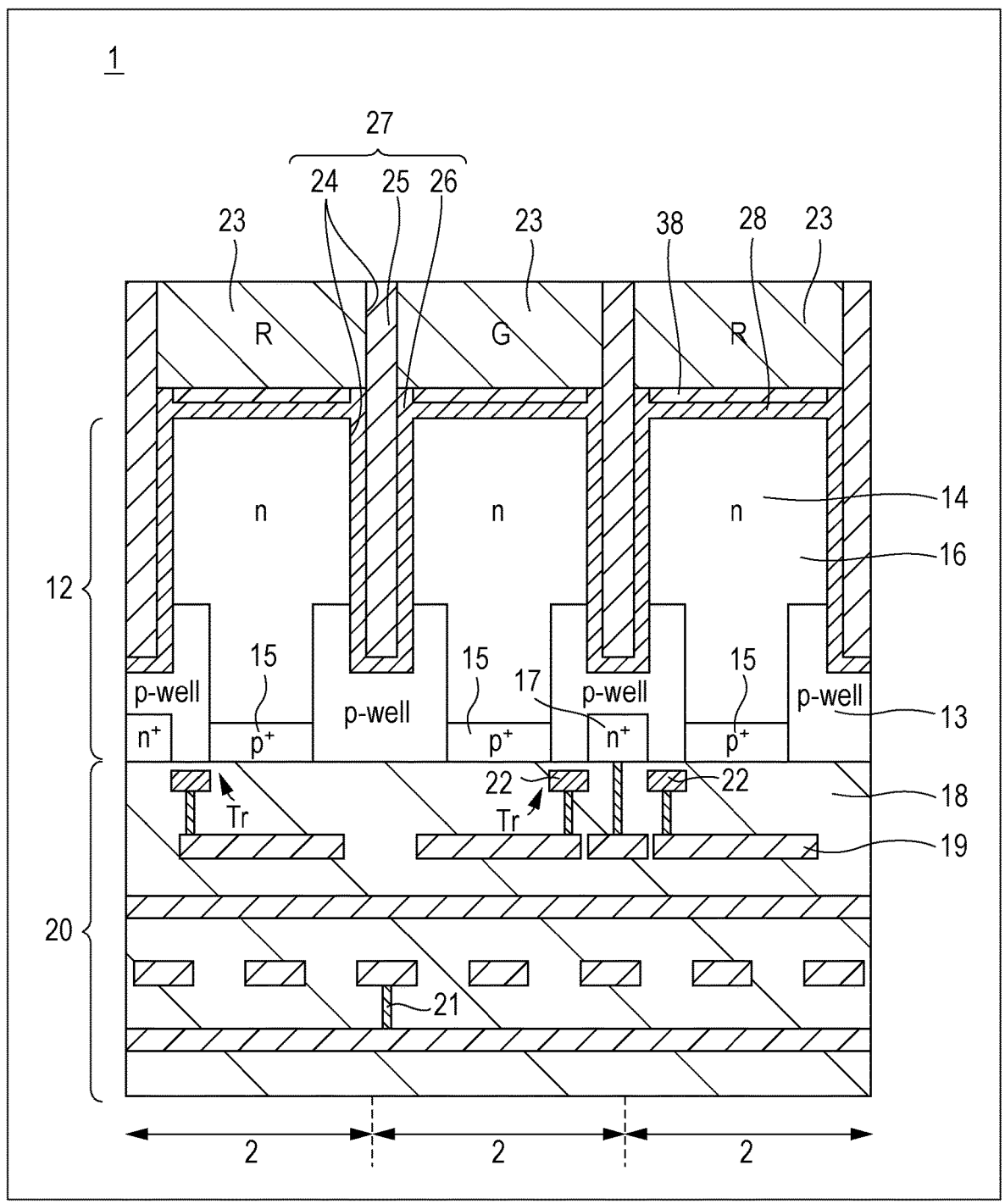
FIG. 2 is a cross-sectional view of the structure in the pixel region of the solid-state imaging device according to the first embodiment of the present disclosure.

FIG. 2 shows the structure of the pixel region 3 of the solid-state imaging device 1 of this embodiment in cross-section. The solid-state imaging device 1 of this embodiment is a CMOS solid-state imaging device of a back-illuminated type, for example. In the description below, a first conductivity type is the n-type, and a second conductivity type is the p-type.

As shown in FIG. 2, the solid-state imaging device 1 of this embodiment includes a substrate 12 that includes photoelectric conversion units 16 provided for the respective pixels 2 and pixel transistors Tr, and an interconnect layer 20 provided on the surface side of the substrate 12. The solid-state imaging device 1 of this embodiment also includes a spectral unit (hereinafter referred to as color filter layers 23) provided on the back surface side of the substrate 12. The solid-state imaging device 1 of this embodiment further includes a device isolating portion 27 that isolates the pixels 2 from one another.

The substrate 12 is formed with a semiconductor substrate made of silicon, and has a thickness of 1 to 6 μm, for example. The substrate 12 is formed with a semiconductor substrate of the first conductive type or the n-type, for example, and well regions 13 formed with impurity regions of the second conductivity type or the p-type, for example, are formed in the surface region of the substrate 12 on which the pixel transistors Tr are formed. In this p-type well regions 13, n-type source/drain regions 17 forming the respective pixel transistors Tr are formed. The pixels 2 provided in the pixel region 3 are arranged in a two-dimensional matrix fashion, and each two adjacent photoelectric conversion units 16 are electrically isolated from each other by the device isolating portion 27. Although not shown in FIG. 2, a peripheral circuit unit is formed in the peripheral region of the pixel region 3.

The photoelectric conversion units 16 are provided for the respective pixels 2 in one-to-one correspondence. The photoelectric conversion units 16 are formed with p-type semiconductor regions 15 formed on the surface side of the substrate 12, and n-type semiconductor regions 14 provided from the depth of the back surface of the substrate 12 to the depth of the p-type semiconductor regions 15. In each of the photoelectric conversion units 16, the principal portion of the photodiode is formed with the pn junction between the p-type semiconductor region 15 and the n-type semiconductor region 14.

In each of these photoelectric conversion units 16, signal charges in accordance with amounts of incident light are generated, and are accumulated in the n-type semiconductor region 14. As the p-type semiconductor regions 15 are provided in the surface of the substrate 12, generation of dark current in the surface of the substrate 12 is restrained.

Each of the pixel transistors Tr is formed with a source/drain region 17 provided on the surface side of the substrate 12, and a gate electrode 22 provided on the surface of the substrate 12 via a gate insulating film not shown in the drawing. Each of the source/drain regions 17 is formed with a high-density n-type semiconductor region provided in the corresponding well region 13, and is formed by ion implantation of an n-type impurity from the surface of the substrate 12.

The gate electrodes 22 are made of polysilicon, for example. Transfer transistors, amplifying transistors, reset transistors, select transistors, and the like are formed as the pixel transistors Tr that drive the pixels 2, but FIG. 2 shows only the transfer transistors as the pixel transistors Tr. Accordingly, the source/drain regions 17 shown in FIG. 2 are equivalent to the drain regions that are the floating diffusion regions forming the transfer transistors.

The color filter layers 23 are made of an organic material, for example, and are provided on the back surface side of the substrate 12 via a back-surface-side fixed charge film 28 having negative fixed charges described later and back-surface-side insulating films 38. The material of the back-surface-side fixed charge film 28 will be described later. The back-surface-side insulating films 38 can be made of a material with a lower refractive index than the color filter layers 23 and the substrate 12, and be made of $SiO_2$, SIN, or the like.

The color filter layers 23 are provided for the respective photoelectric conversion units 16, and a filter layer that selectively passes light of R (red), G (green), or B (blue) is provided for each pixel 2. Light of a desired wavelength is transmitted through the color filter layers 23, and the transmitted light enters the photoelectric conversion units 16 in the substrate 12.

The device isolating portion 27 is formed with a groove portion 24 formed to extend from the surfaces of the color filter layers 23 to a predetermined depth in the substrate 12, and a negative-fixed-charge-containing film (hereinafter referred to as the in-groove fixed charge film 26) and an insulating film 25 that are buried in the groove portion 24 in this order. The device isolating portion 27 is formed in a grid-like pattern, and is designed to isolate the pixels 2 from one another.

The groove portion 24 is formed to extend from the surfaces of the color filter layers 23 to the well regions 13 in which the source/drain regions 17 of the pixel transistors Tr in the substrate 12 are formed, but not to reach the source/drain regions 17.

The in-groove fixed charge film 26 is formed to cover the inner wall surfaces of the groove portion 24 on the side of the substrate 12. In this embodiment, the back-surface-side fixed charge film 28 and the in-groove fixed charge film 26 are formed with an insulating film containing fixed charges (negative fixed charges in this embodiment) of the same polarity as the signal charges stored in the photoelectric conversion units 16. Further, in this embodiment, the in-groove fixed charge film 26 forming the device isolating portion 27 is made of a material with a lower refractive index than the materials forming the substrate 12 and the color filter layers 23.

The insulating film containing negative fixed charges may be a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film, for example. Examples of methods of forming this insulating film include a chemical vapor deposition technique (CVD technique), a sputtering technique, an atomic layer deposition technique (ALD technique), and the like. By using an atomic layer deposition method, a $SiO_2$ film that is approximately 1 nm and reduces interface states during film formation can be formed at the same time. Examples of materials other than the above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), and the like. Examples of such materials further include samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), and the like. Examples of such materials further include holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), and the like. Further, the above insulating film containing negative fixed charges maybe formed with a hafnium nitride film, an aluminum nitride film, a hafnium oxynitride film, or an aluminum oxynitride film.

Silicon (Si) or nitrogen (N) may be added to the insulating film containing negative fixed charges, without degrading insulation properties. The density of the silicon or nitrogen to be added is determined so as not to degrade the insulation properties of the film. As silicon (Si) or nitrogen (N) is added to the insulating film in this manner, the heat-resisting properties of the insulating film and the ion implantation blocking capability during a process can be improved.

Of the above mentioned insulating films containing negative fixed charges, an insulating film with a lower refractive index than the material forming the substrate 12 can form the in-groove fixed charge film 26. The material of the in-groove fixed charge film 26 may be $HfO_2$ or $Ta_2O_5$, for example.

As the insulating films containing negative fixed charges (the in-groove fixed charge film 26 and the back-surface-side fixed charge film 28) are formed on the inner wall surfaces of the groove portion 24 and the back surface of the substrate 12 in this embodiment, an inversion layer is formed on the surface in contact with those insulating films containing negative fixed charges. With this, an inversion layer with charges (holes in this embodiment) of the opposite polarity of the signal charges is formed on the inner wall surfaces of the groove portion 24 formed in the substrate 12 and on the back surface of the substrate 12, and this inversion layer restrains generation of dark current.

The insulating film 25 is formed to fill the groove portion 24 coated with the in-groove fixed charge film 26. The insulating film 25 is made of an insulating material having a lower refractive index than the materials forming the substrate 12 and the color filter layers 23 and the fixed charge films, and may be formed with $SiO_2$, SiN, or the like.

Although the groove portion 24 is filled with the insulating film 25 in this embodiment, the in-groove fixed charge film 26 may be designed to be thick, and the groove portion 24 may be filled only with the in-groove fixed charge film 26. In this case, the in-groove fixed charge film should be made of a material having a lower refractive index than the refractive index of the color filter layers 23. Alternatively, the in-groove fixed charge film 26 may fill only the groove portion 24 formed in the substrate 12, and the groove portion 24 between the color filter layers 23 may not be filled with anything.

The interconnect layer 20 is formed on the surface side of the substrate 12, and is designed to include interconnects 19 (four layers in this embodiment), with an interlayer insulating film 18 being interposed between these interconnects 19. Also, the interconnects 19 located on one another, and the interconnects 19 and the pixel transistors Tr are connected via connection vias 21 formed in the interlayer insulating film 18 as necessary.

In the solid-state imaging device 1 having the above described structure, the back surface side of the substrate 12 is illuminated with light, and the light transmitted through the color filter layers 23 is photoelectrically converted by the photoelectric conversion units 16. In this manner, signal charges are generated. The signal charges generated by the photoelectric conversion units 16 are then output as pixel signals from vertical signal lines (not shown) formed with the predetermined interconnects 19 in the interconnect layer 20, via the pixel transistors Tr formed on the surface side of the substrate 12.

In this embodiment, the refractive indexes of the in-groove fixed charge film 26 and the insulating film 25 formed in the groove portion 24 are lower than the refractive indexes of the substrate 12 and the color filter layers 23.

Accordingly, in the solid-state imaging device 1 of this embodiment, a light collecting tube structure is formed, with the core being the color filter layers 23 and the photoelectric conversion units 16 formed in the substrate 12, the cladding being the device isolating portion 27.

With this arrangement in the solid-state imaging device 1 of this embodiment, light that enters the device isolating portion 27 is absorbed by the color filter layers 23 and the substrate 12 having higher refractive indexes than that of the device isolating portion 27. Meanwhile, in the light incidence surface, light that enters the color filter layers 23 does not enter the device isolating portion 27. Therefore, light that obliquely enters a predetermined color filter layer 23 does not enter the color filter layer 23 of an adjacent pixel 2.

Furthermore, in the solid-state imaging device 1 of this embodiment, the photoelectric conversion units 16 are electrically isolated from one another by the device isolating portion 27 in the substrate 12. Accordingly, the signal charges generated by a photoelectric conversion unit 16 do not leak into the photoelectric conversion unit 16 of an adjacent pixel 2. Accordingly, color mixing can be restrained.

As described above, the device isolating portion 27 formed in this embodiment functions to optically isolate the pixels 2 from one another among the color filter layers 23, and electrically isolate the pixels 2 from one another among the photoelectric conversion units 16.

Also, in the device isolating portion 27, an insulating portion such as the insulating film 25 buried in the groove portion 24 is preferably designed to be level with the surfaces of the color filter layers 23 in the light incidence surface or protrude from the surfaces (the light incidence surfaces) of the color filter layers 23. As the device isolating portion 27 prevents the color filter layers 23 from connecting to each other between adjacent pixels 2, optical isolation among the color filter layers 23 can be secured.

Also, in the solid-state imaging device 1 of this embodiment, light can be divided by the respective pixels 2 on the incidence surface boundary of the solid-state imaging device 1. Accordingly, light collection by semi-spherical on-chip lenses that are used in conventional solid-state imaging devices is unnecessary. In a case where a conventional solid-state imaging device is incorporated into an imaging apparatus such as a camera, the optimum positions of on-chip lenses, color filter layers, and photoelectric conversion units need to be corrected in accordance with the characteristics of an optical system that is set for forming images on the solid-state imaging device.

In this embodiment, on the other hand, light can be divided by the pixels 2 on the incidence surface boundary of the solid-state imaging device 1. Therefore, the above correction, or pupil correction, is unnecessary. Accordingly, there is no need to change the design of the solid-state imaging device 1 in accordance with an optical system set in an imaging apparatus in this embodiment. Also, with the use of the solid-state imaging device 1 of this embodiment, the compatible range becomes wider and a higher degree of freedom is allowed for lenses in the case of an interchangeable lens imaging apparatus or in a case where the eye pupil distance varies with the focal lengths of zoom lenses.

1-3. Manufacturing Method

Next, a method of manufacturing the solid-state imaging device 1 of this embodiment is described. FIGS. 3A through 4E are process charts showing the method of manufacturing the solid-state imaging device 1 of this embodiment.

Figure 3A:
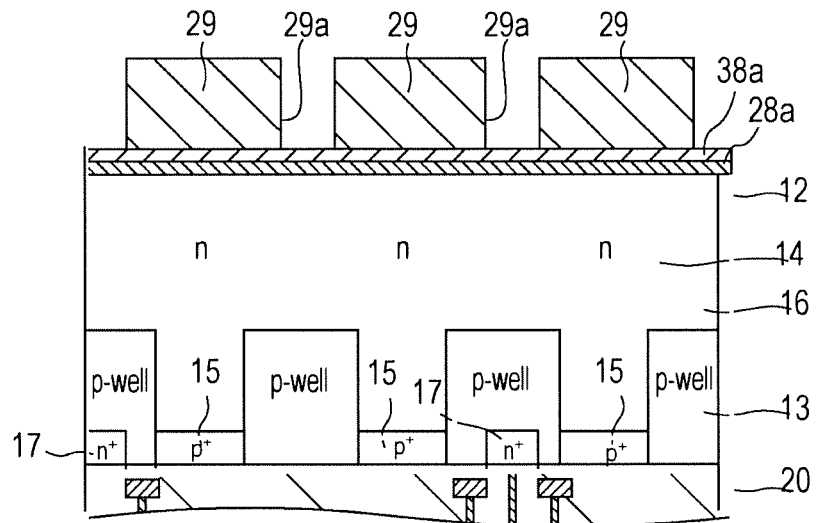
FIGS. 3A through 3C are process charts (a first half) showing a method of manufacturing the solid-state imaging device according to the first embodiment of the present disclosure.

First, as shown in FIG. 3A, after the photoelectric conversion units 16 and the pixel transistors Tr are formed in the substrate 12, the interlayer insulating film 18 and the interconnects 19 are alternately formed on the surface of the substrate 12, to form the interconnect layer 20. In the process charts shown in FIGS. 3A through 4F, only the interconnect layer 20 near the surface of the substrate 12 is shown. The impurity regions such as the photoelectric conversion units 16 and the source/drain regions 17, which are formed in the substrate 12, are formed by implanting ions of a predetermined impurity from the surface side of the substrate 12, for example.

A supporting substrate (not shown) formed with a silicon substrate is bonded to the uppermost layer of the interconnect layer 20, and the substrate 12 is turned upside down. The manufacturing procedures up to this point are the same as the procedures for manufacturing a conventional solid-state imaging device of a back-illuminated type. Although not shown in the drawings, after the substrate 12 is turned upside down, the back surface side of the substrate 12 is polished to reduce the thickness of the substrate 12 to a desired thickness.

As shown in FIG. 3A, a fixed charge film 28a and an insulating film 38a are then formed on the entire back surface of the substrate 12, and a hard mask 29 made of SiN, for example, is formed on the insulating film 38a. The hard mask 29 is formed by forming a SiN layer on the back surface of the substrate 12 by low-temperature CVD, and then performing etching on the SiN layer so as to leave the SiN layer only on the photoelectric conversion units 16 of the respective pixels 2 by using a photolithography technique. In this manner, the hard mask 29 having an opening 29a immediately above the region in which the device isolating portion 27 is to be formed is completed.

Figure 3B:
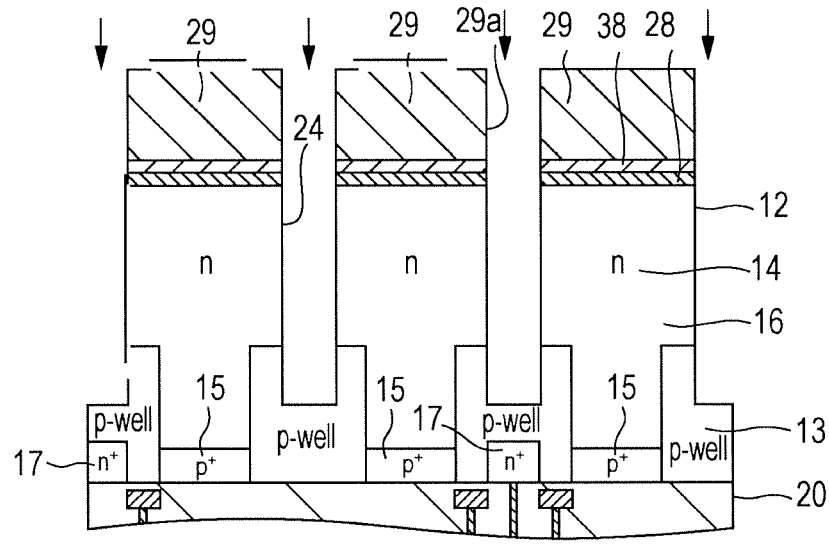

As shown in FIG. 3B, the groove portion 24 is then formed. The groove portion 24 is formed by performing etching on the substrate 12 until the groove reaches a predetermined depth via the hard mask 29 or a depth at which the well regions 13 are located in this embodiment. At this point, the fixed charge film 28a and the insulating film 38a exposed through the opening 29a of the hard mask 29 are also subjected to the etching. As a result, the back-surface-side fixed charge film 28 and the back-surface-side insulating film 38 are formed in the region corresponding to the respective photoelectric conversion units 34 on the back surface of the substrate 12.

Figure 3C:
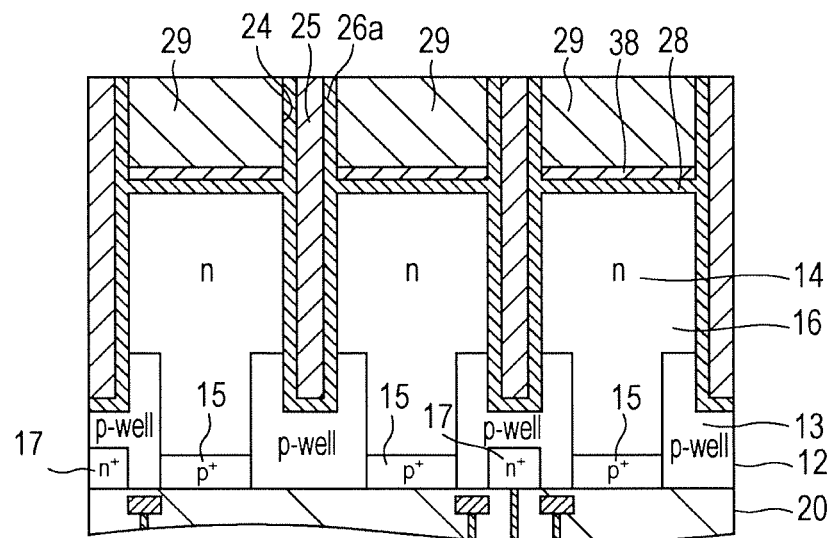

As shown in FIG. 3C, an in-groove fixed charge film 26a and the insulating film 25 are then formed in this order in the groove portion 24. In this stage, the in-groove fixed charge film 26a is first formed by using CVD, a sputtering technique, ALD, or the like, so as to cover the inner wall surfaces of the groove portion 24. The in-groove fixed charge film 26a formed in this stage is to form the in-groove fixed charge film 26 shown in FIG. 2. After that, the insulating film 25 to fill the groove portion 24 is formed by using SOG (Spin on Glass) or CVD. In this embodiment, $SiO_2$ is used as the insulating film 25.

At this point, the in-groove fixed charge film 26a and the insulating film 25 are also formed on the surface of the hard mask 29. Therefore, after the in-groove fixed charge film 26a and the insulating film 25 are formed, the in-groove fixed charge film 26a and the insulating film 25 formed on the hard mask surface are polished by using CMP (Chemical Mechanical Polishing) until the hard mask 29 is exposed. In this manner, the in-groove fixed charge film 26a and the insulating film 25 are formed in the groove portion 24 as shown in FIG. 3C.

Figure 4D:
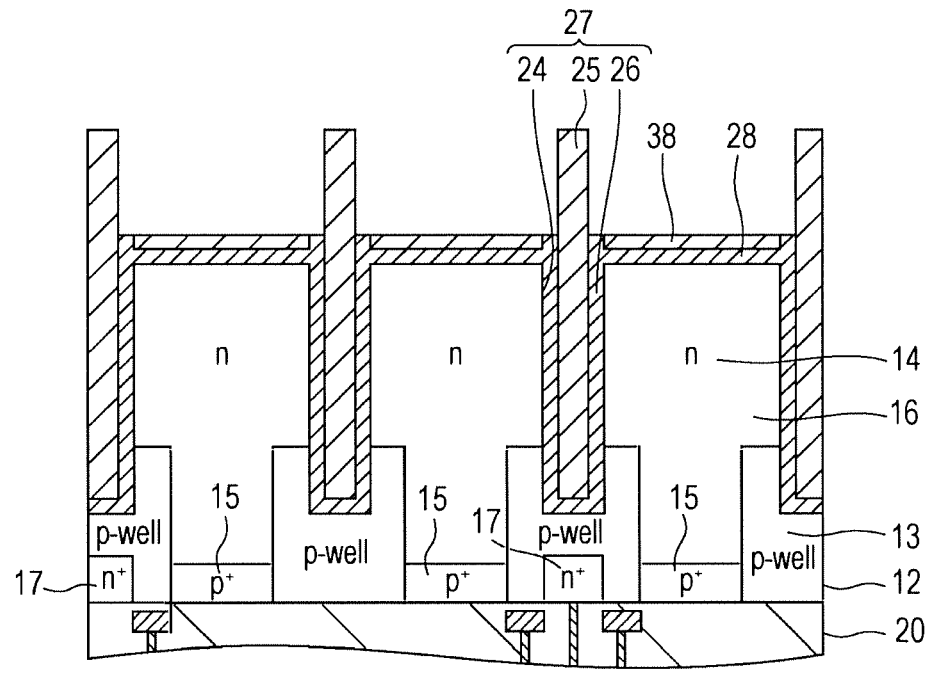
FIGS. 4D and 4E are process charts (a second half) showing the method of manufacturing the solid-state imaging device according to the first embodiment of the present disclosure.

As shown in FIG. 4D, the SiN film used as the hard mask 29 is then removed by wet etching. In this stage, the portions of the in-groove fixed charge film 26a protruding from the back surface of the substrate 12 are also removed together with the hard mask 29, as shown in FIG. 4D. As a result, the in-groove fixed charge film 26 remains only in the groove portion 24 formed in the substrate 12. Since the back-surface-side insulating film 38 is formed on the back surface side of the substrate 12 at this point, the back-surface-side fixed charge film 28 is not removed.

Figure 4E:
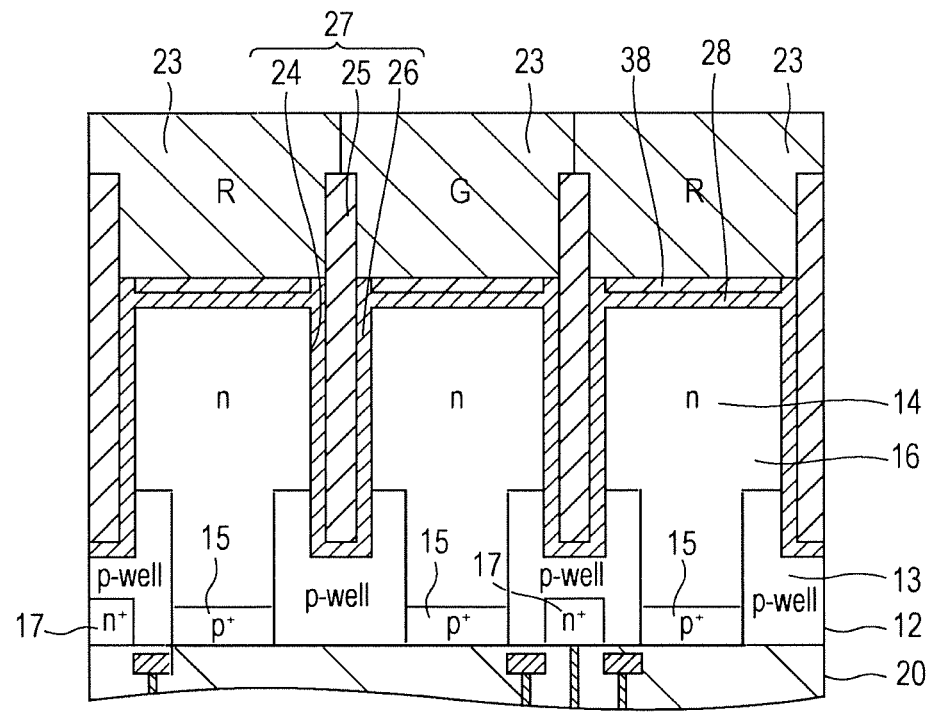

As shown in FIG. 4E, the desired color filter layers 23 are then formed for the respective pixels 2 by using a lithography technique. In this case, the color filter layers 23 are formed so as to fill the concave portions formed by the substrate 12, and the in-groove fixed charge film 26 and the insulating film 25 protruding from the back surface of the substrate 12, as shown in FIG. 4E.

After that, the color filter layers 23 are polished by using CMP until the in-groove fixed charge film 26 formed on the surface of the insulating film 25 is exposed, for example. As a result, the solid-state imaging device 1 shown in FIG. 2 is completed. Although the color filter layers 23 are polished until the in-groove fixed charge film 26 is exposed in this embodiment, the polishing maybe continued until the surfaces of the color filter layers 23 become closer to the substrate 12 than the surface of the in-groove fixed charge film 26 is.

Although the groove portion 24 formed to extend from the color filter layers 23 to the substrate 12 is formed through one procedure in the solid-state imaging device 1 of this embodiment, the present technique is not limited to that. For example, the device isolating portion 27 that isolates the photoelectric conversion units 16 from one another in the substrate 12 maybe formed through a different procedure from the procedure for forming the device isolating portion 27 that isolates the color filter layers 23 from one another.

In a case where the device isolating portion 27 in the substrate 12 is formed through a different procedure from the procedure for forming the device isolating portion 27 for the color filter layers 23, however, there might be misalignment between the device isolating portions 27 in the boundary surfaces between the substrate 12 and the color filter layers 23. In such a case, sensitivity loss and color mixing degradation are caused. By the method of manufacturing the solid-state imaging device 1 of this embodiment, the groove portion 24 forming the device isolating portion 27 is formed by one etching procedure. Accordingly, process differences (misalignment in the device isolating portion 27) can be made smaller, and the number of manufacturing procedures can be made smaller, compared with those in a case where the device isolating portion 27 in the substrate 12 is formed through a different procedure from the procedure for forming the device isolating portion 27 for the color filter layers 23.

Since the process differences can be made smaller in this embodiment, sensitivity loss and color mixing degradation can be prevented more effectively than in a case where the device isolating portion 27 in the substrate 12 is formed through a different procedure from the procedure for forming the device isolating portion 27 for the color filter layers 23.

Although an n-type semiconductor substrate is used as the substrate 12 in this embodiment, a semiconductor substrate including an n-type epitaxial layer in which impurity density becomes higher toward the surface side may be used as the substrate 12, for example. Other than that, a semiconductor substrate including a p-type epitaxial layer in which impurity density becomes lower toward the surface side may be used as the substrate 12. As such a semiconductor substrate is used as the substrate 12, electric fields can be readily formed by the transfer transistors. Accordingly, even in a case where the semiconductor layer on which the photoelectric conversion units 32 are formed is thick, signal charges can be prevented from failing to be transferred.

Figure 5:
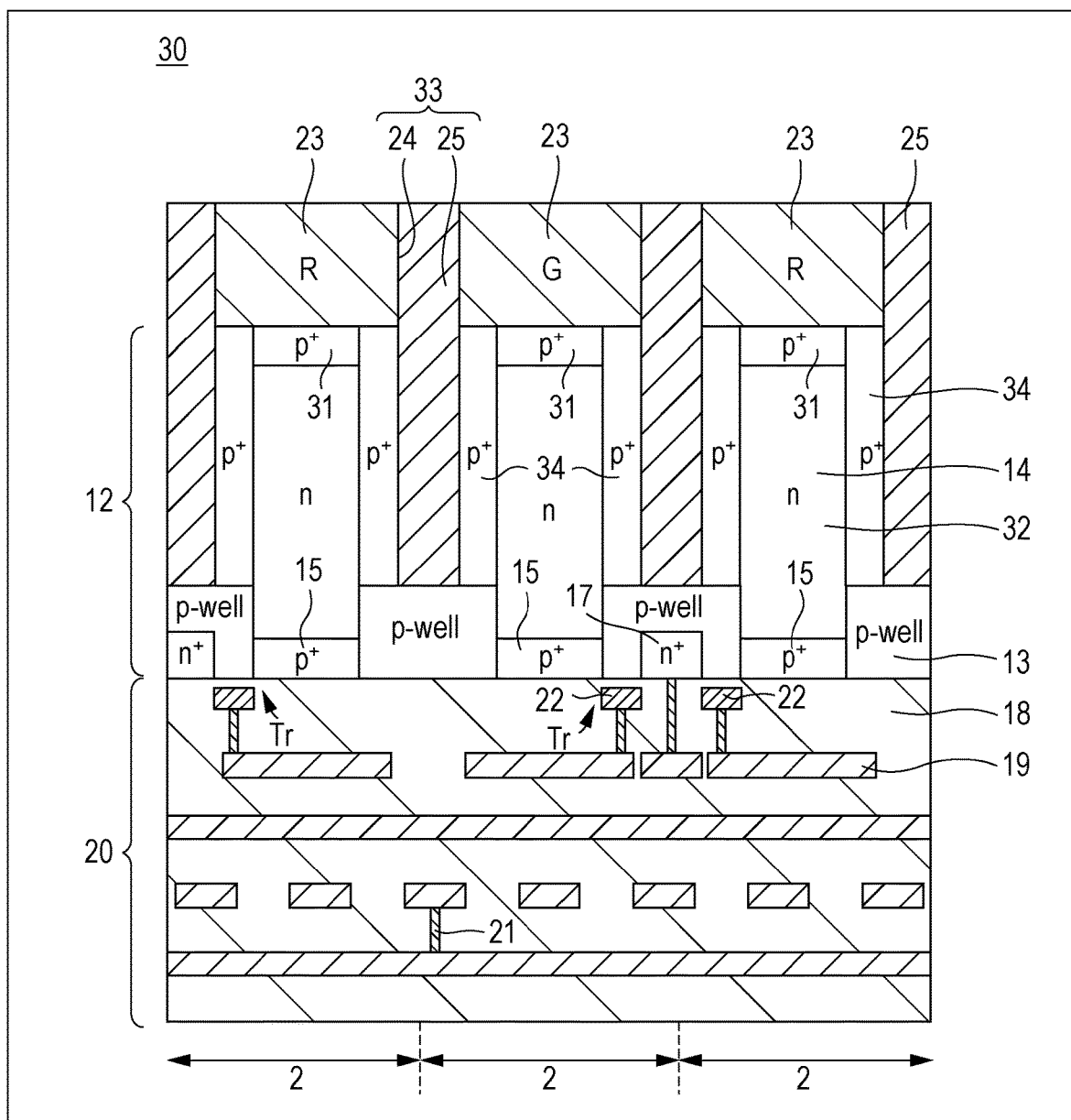
FIG. 5 is a cross-sectional view of the structure in the pixel region of a solid-state imaging device according to a second embodiment of the present disclosure.

2. Second Embodiment: Example Where a Pixel Isolating Portion is Provided on a Substrate FIG. 5 is a cross-sectional view of the main components of a solid-state imaging device according to a second embodiment of the present disclosure. The solid-state imaging device 30 of this embodiment differs from the first embodiment in that the in-groove fixed charge film and the back-surface-side fixed charge film are not formed. Therefore, in FIG. 5, the same components as those shown in FIG. 2 are denoted by the same reference numerals as those used in FIG. 2, and explanation of them is not repeated herein. Also, the entire structure of the solid-state imaging device 30 of this embodiment is the same as the structure shown in FIG. 1, and therefore, explanation thereof will not be repeated herein.

In the solid-state imaging device 30 of this embodiment, each of photoelectric conversion units 32 is formed with high-density p-type semiconductor regions 31 and 15 formed on the back surface and the surface of the substrate 12, and an n-type semiconductor region 14 formed between the two p-type semiconductor regions 31 and 15. That is, in the solid-state imaging device 30 of this embodiment, the pn junctions of the p-type semiconductor regions 31 and 15 and the n-type semiconductor regions 14 form principal photodiodes.

Also, in the solid-state imaging device 30 of this embodiment, a pixel isolating portion 34 formed with a p-type semiconductor region is formed so as to isolate the photoelectric conversion units 32 from one another in the substrate 12, as shown in FIG. 5. The pixel isolating portion 34 is formed to extend from the back surface of the substrate 12 to the depth of the well regions 13 in which the source/drain regions 17 of the pixel transistors Tr are formed, for example.

In this embodiment, a device isolating portion 33 is formed inside the pixel isolating portion 34 designed to isolate the photoelectric conversion units 32 from one another in the substrate 12. That is, in the substrate 12, the side peripheral surfaces of the device isolating portion 33 are covered with the p-type semiconductor region forming the pixel isolating portion 34. In this embodiment, the device isolating portion 33 is also formed to extend to the depth of the well regions 13 in which the source/drain regions 17 of the pixel transistors Tr are formed.

The pixel isolating portion 34 and the p-type semiconductor regions 31 can be formed by implanting ions of a p-type impurity at high density from the surface of the substrate 12 before the interconnect layer 20 is formed.

Alternatively, the pixel isolating portion 34 and the p-type semiconductor regions 31 may be formed by implanting ions of a p-type impurity at high density from the back surface side of the substrate 12 after the interconnect layer 20 is formed on the surface of the substrate 12, the substrate 12 is turned upside down, and the substrate 12 is subjected to film thinning treatment.

In the solid-state imaging device 30 of this embodiment, the device isolating portion 33 is formed with the groove portion 24 formed to extend from the color filter layers 23 to a predetermined depth in the substrate 12, and the insulating film 25 buried in the groove portion 24. This insulating film 25 can be made of the same material as the insulating film 25 of the first embodiment. That is, in the solid-state imaging device 30 of this embodiment, insulating films containing negative fixed charges are not formed on the inner wall surfaces of the device isolating portion 27 and the back surface of the substrate 12.

Since the p-type semiconductor regions 31 and 15 are formed on the back surface and the surface of the substrate 12 in the solid-state imaging device 30 of this embodiment, dark current to be generated in the interfaces of the substrate 12 can be reduced. Furthermore, as the groove portion 24 forming the device isolating portion 33 is surrounded by p-type semiconductor regions (the pixel isolating portion 34 and the well regions 13), dark current to be generated in the inner wall surfaces of the groove portion 24 can be reduced.

As described above, in this embodiment, the groove portion 24 is surrounded by the p-type semiconductor regions that form the pixel isolating portion 34 and the well regions 13, and the p-type semiconductor regions 31 are also formed on the back surface of the substrate 12. Accordingly, in the interfaces of the substrate 12, dark current can be reduced by the layers of the opposite polarity of the polarity of the signal charges to be generated by the photoelectric conversion units 32, and there is no need to form insulating films that contain negative fixed charges and cover the inner wall surfaces of the groove portion 24 and the back surface of the substrate 12 in this embodiment.

Since there is no need to form insulating films containing negative fixed charges in the solid-state imaging device 30 of this embodiment, the procedures for forming the insulating films containing negative fixed charges can be skipped in the procedures of the first embodiment shown in FIGS. 3C and 4E. In this embodiment, the device isolating portion 33 is also formed to extend from the color filter layers 23 to a predetermined depth in the substrate 12, and accordingly, the same effects as those of the first embodiment can be achieved.

In this embodiment, insulating films containing negative fixed charges may also be formed on the inner wall surfaces of the groove portion 24 and the back surface of the substrate 12, as in the first embodiment. In such a case, the hole pinning effect of the insulating films containing negative fixed charges becomes greater, and accordingly, the dark current reducing effect also becomes greater. In a case where insulating films containing negative fixed charges are formed on the inner wall surfaces of the groove portion 24 and the back surface of the substrate 12 in this embodiment, the impurity densities in the p-type semiconductor region forming the pixel isolating portion 34 and the p-type semiconductor regions 31 forming the photoelectric conversion units 32 can be made lower.

Also, in this embodiment, a conductive film such as an ITO film may be buried in the groove portion 24 via an insulating film, and a negative potential may be applied to the conductive film. In this case, holes are generated in the inner wall surfaces of the groove portion 24, and accordingly, dark current can be reduced.

Figure 6:
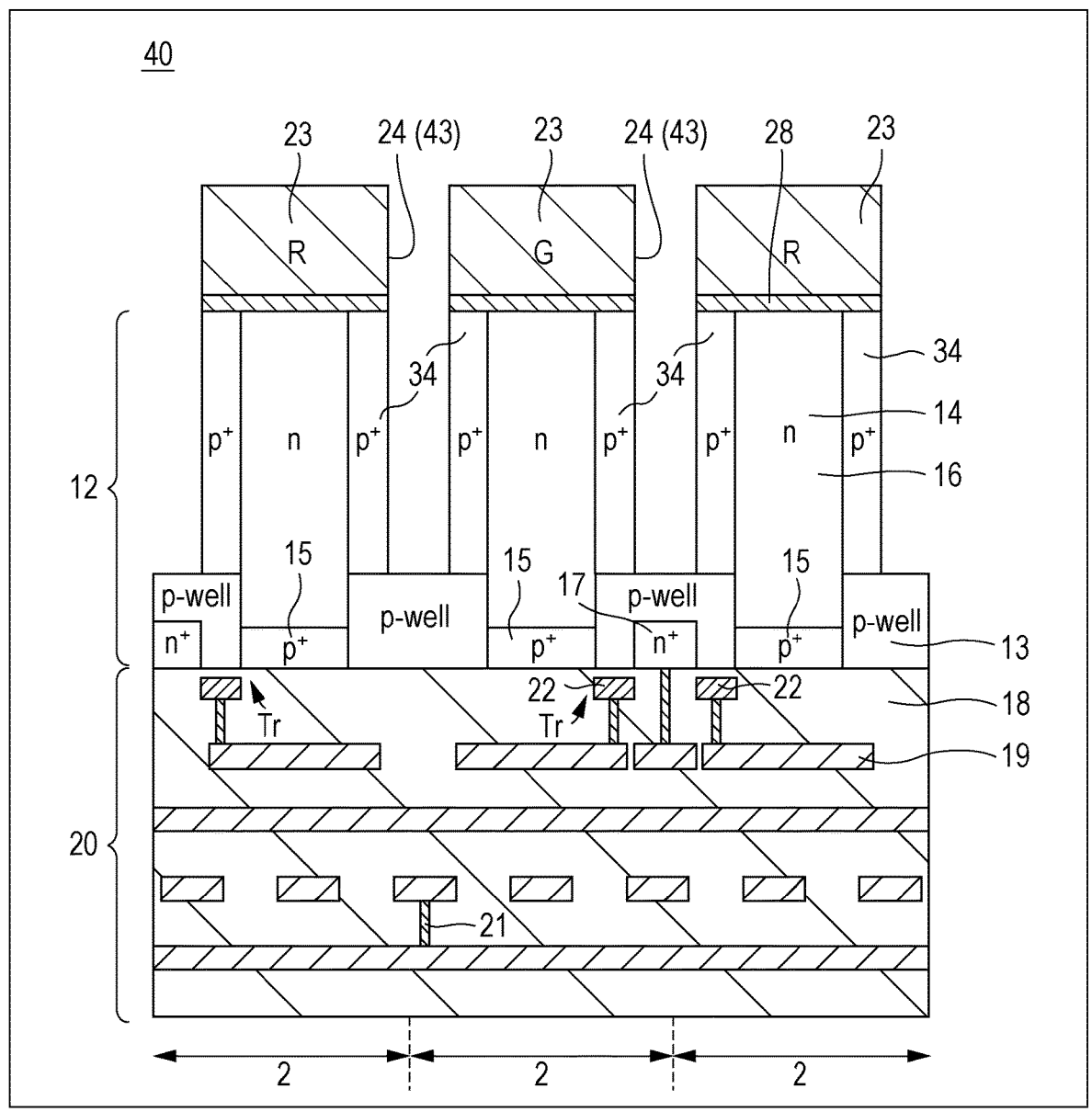
FIG. 6 is a cross-sectional view of the structure in the pixel region of a solid-state imaging device according to a third embodiment of the present disclosure.

3. Third Embodiment: (First) Example Where a Device Isolating Portion is Hollow Next, a solid-state imaging device according to a third embodiment of the present disclosure is described. FIG. 6 is a cross-sectional view of the main components of the solid-state imaging device 40 of this embodiment. This embodiment differs from the second embodiment in that the in-groove fixed charge film and the insulating film that cover the inner wall surfaces of the groove portion 24 are not provided. Therefore, in FIG. 6, the same components as those shown in FIGS. 2 and 5 are denoted by the same reference numerals as those used in FIGS. 2 and 5, and explanation of them is not repeated herein. Also, the entire structure of the solid-state imaging device 40 of this embodiment is the same as the structure shown in FIG. 1, and therefore, explanation thereof will not be repeated herein.

3-1. Structures of Main Components

In the solid-state imaging device 40 of this embodiment, the groove portion 24 is hollow, and the unfilled groove portion 24 forms a device isolating portion 43. In the solid-state imaging device 40 of this embodiment, the groove portion 24 is formed in the pixel isolating portion 34 formed with a p-type semiconductor region, as in the second embodiment. As the groove portion 24 is formed in the pixel isolating portion 34 formed with a p-type semiconductor region, dark current to be generated in the inner wall surfaces of the groove portion 24 can be reduced.

3-2. Manufacturing Method

Figure 7A:
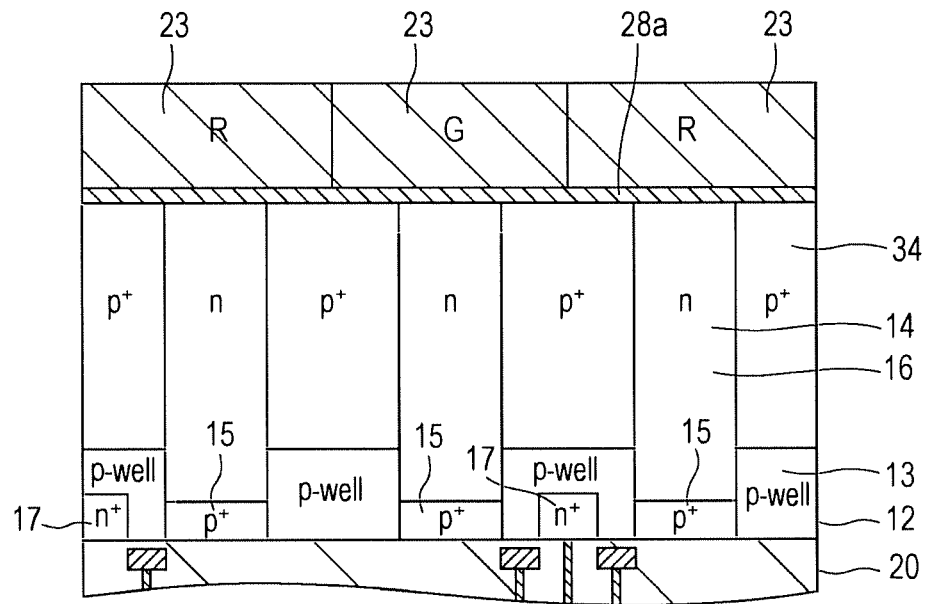
FIGS. 7A and 7B are process charts showing a method of manufacturing the solid-state imaging device according to the third embodiment of the present disclosure.
Figure 7B:
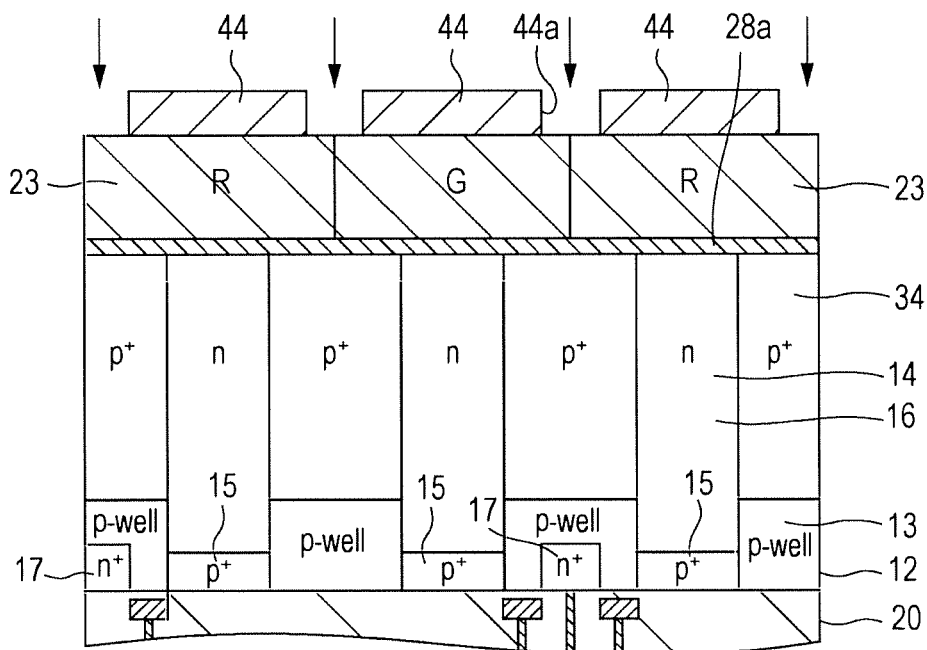

Next, a method of manufacturing the solid-state imaging device 40 of this embodiment is described. FIGS. 7A and 7B are process charts showing the method of manufacturing the solid-state imaging device 40 of this embodiment.

First, as shown in FIG. 7A, after the photoelectric conversion units 16, the pixel isolating portion 34, and the pixel transistors Tr are formed in the substrate 12, the interlayer insulating film 18 and the interconnects 19 are alternately formed on the surface of the substrate 12, to form the interconnect layer 20. In the process charts shown in FIGS. 7A and 7B, only the interconnect layer 20 near the surface of the substrate 12 is shown. The impurity regions such as the photoelectric conversion units 16, the pixel isolating portion 34, and the source/drain regions 17, which are formed in the substrate 12, are formed by implanting ions of a predetermined impurity from the surface side of the substrate 12.

A supporting substrate (not shown) formed with a silicon substrate is bonded to the uppermost layer of the interconnect layer 20, and the substrate 12 is then turned upside down. The manufacturing procedures up to this point are the same as the procedures for manufacturing a conventional solid-state imaging device of a back-illuminated type. Although not shown in the drawings, after the substrate 12 is turned upside down, the back surface side of the substrate 12 is polished to reduce the thickness of the substrate 12 to a desired thickness. The pixel isolating portion 34 may be formed by implanting ions of a p-type impurity at a desired depth from the back surface side of the substrate 12 after the substrate 12 is thinned.

After that, as shown in FIG. 7A, the fixed charge film 28a to be the back-surface-side fixed charge film 28 is formed on the back surface of the substrate 12, and the color filter layers 23 are formed on the fixed charge film 28a. The fixed charge film 28a is formed by using CVD, a sputtering technique, ALD, or the like. The color filter layers 23 are formed for the respective pixels by using a lithography technique. Since the procedure for removing the fixed charge film between the color filter layers 23 as shown in FIG. 4D is not carried out in this embodiment, the back-surface-side insulating film 38 shown in FIG. 4D is unnecessary.

As shown in FIG. 7B, a hard mask 44 formed with an inorganic film that has an opening portion 44a immediately above the region to form the groove portion 24 is then formed over the color filter layers 23. The hard mask 44 is formed by forming a SiN layer over the color filter layers 23, and then performing etching so as to leave the SiN layer on the photoelectric conversion units 16 of the respective pixels 2 by using a photolithography technique.

Etching is then performed via the hard mask 44, to form the groove portion 24. The groove portion 24 is formed by performing etching on the substrate 12 until the groove reaches a predetermined depth via the hard mask 44 or a depth at which the well regions 13 are located in this embodiment. At this point, the fixed charge film 28a exposed through the opening 29a of the hard mask 29 is also subjected to the etching. As a result, the back-surface-side fixed charge film 28 is formed in the region corresponding to the respective photoelectric conversion units 34 on the back surface of the substrate 12. After that, the hard mask 44 is removed, and the solid-state imaging device 40 of this embodiment shown in FIG. 6 is completed.

Although not shown in the drawings, a passivation film may be formed so as to cover the inner wall surfaces of the groove portion 24 and the surfaces of the color filter layers 23, as necessary. The passivation film can be formed by using low-temperature CVD, for example.

In the solid-state imaging device 40 of this embodiment, the device isolating portion 43 is formed with the hollow groove portion 24. Therefore, at the time of packaging, this hollow groove portion 24 is filled with air. Air has a lower refractive index than the color filter layers 23 made of an organic material and the substrate 12 made of silicon. Accordingly, in this embodiment, a light collecting tube structure is formed as in the first embodiment, with the core being the photoelectric conversion units 16 and the color filter layers 23, the cladding being the groove portion 24 (the device isolating portion 43).

Therefore, light that obliquely enters the surface of a predetermined color filter layer 23 does not enter the color filter layer 23 of an adjacent pixel 2 among the color filter layers 23. Furthermore, the signal charges generated by a photoelectric conversion unit 16 in the substrate 12 do not leak into the photoelectric conversion unit 16 of an adjacent pixel 2. As described above, the device isolating portion 43 formed in this embodiment functions to optically isolate the pixels 2 from one another among the color filter layers 23, and electrically isolate the pixels 2 from one another among the photoelectric conversion units 16, as in the first embodiment.

As there is no need to bury a fixed charge film in the groove portion 24 in the solid-state imaging device 40 of this embodiment, the number of procedures can be reduced. Although the SiO$_2$ layer formed as the hard mask 44 is removed in this embodiment, the hard mask 44 can remain as a low reflecting coating when the material and the thickness of the inorganic film forming the hard mask 44 are appropriately selected. In this case, the inorganic film used as the hard mask 44 may be made of a single material, or may be formed with a film stack of films made of different materials, such as a film stack of a SiO$_2$ film and a SiN film.

3-3. Modification

Figure 8:
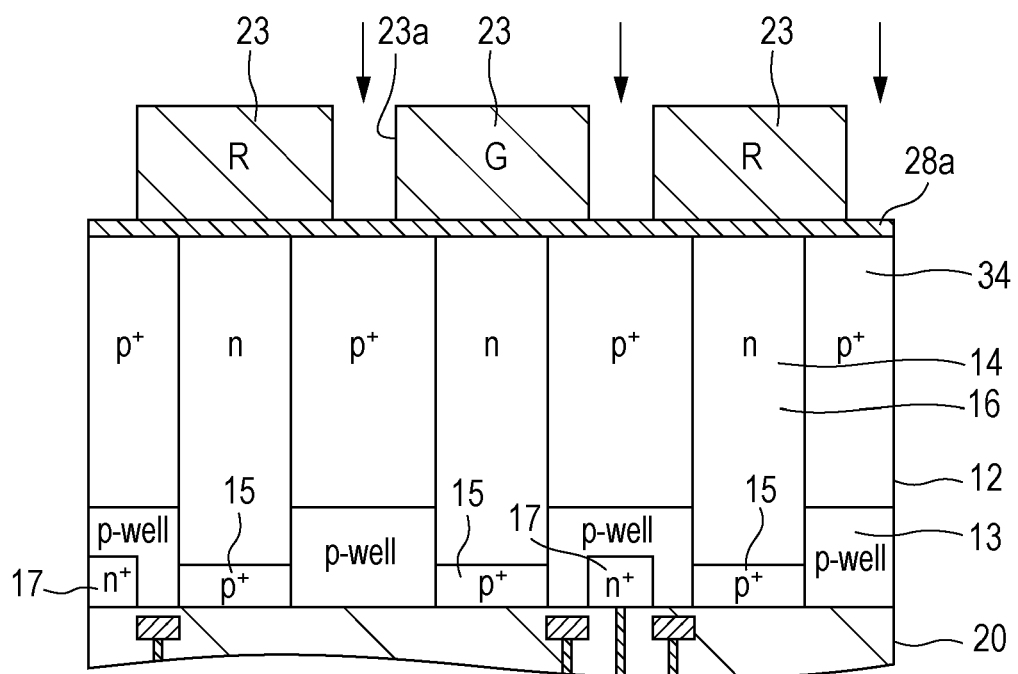
FIG. 8 is a process chart showing another example of a method of manufacturing the solid-state imaging device according to the third embodiment of the present disclosure.

Next, another example of the method of manufacturing the above described solid-state imaging device 40 according to the third embodiment is described as a modification. FIG. 8 is a diagram showing one procedure in the method of manufacturing the solid-state imaging device 40 according to the modification.

In the modification, the procedures up to the formation of a fixed charge film on the back surface of the substrate 12 are the same as those of the third embodiment, and the procedure for forming the groove portion 24 differs from that of the third embodiment. Therefore, explanation of the procedures up to the formation of the back-surface-side fixed charge film 28 on the back surface of the substrate 12 is not repeated herein.

As shown in FIG. 8, in the modification, the fixed charge film 28a to be the back-surface-side fixed charge film 28 is formed on the back surface of the substrate 12, and the color filter layers 23 having an opening 23a immediately above the region forming the groove portion 24 are then formed by using a photolithography technique. In this manner, the color filter layers 23 are formed at a distance from one pixel to another. As the color filter layers 23 formed as shown in FIG. 8 serve as a mask, etching is performed on the back-surface-side fixed charge film 28 and the substrate 12, to complete the solid-state imaging device 40 shown in FIG. 6.

As described above, the number of procedures can be reduced by using the color filter layers 23 as a mask and forming the groove portion 24 after the patterning of the color filter layers 23 is performed.

Figure 9:
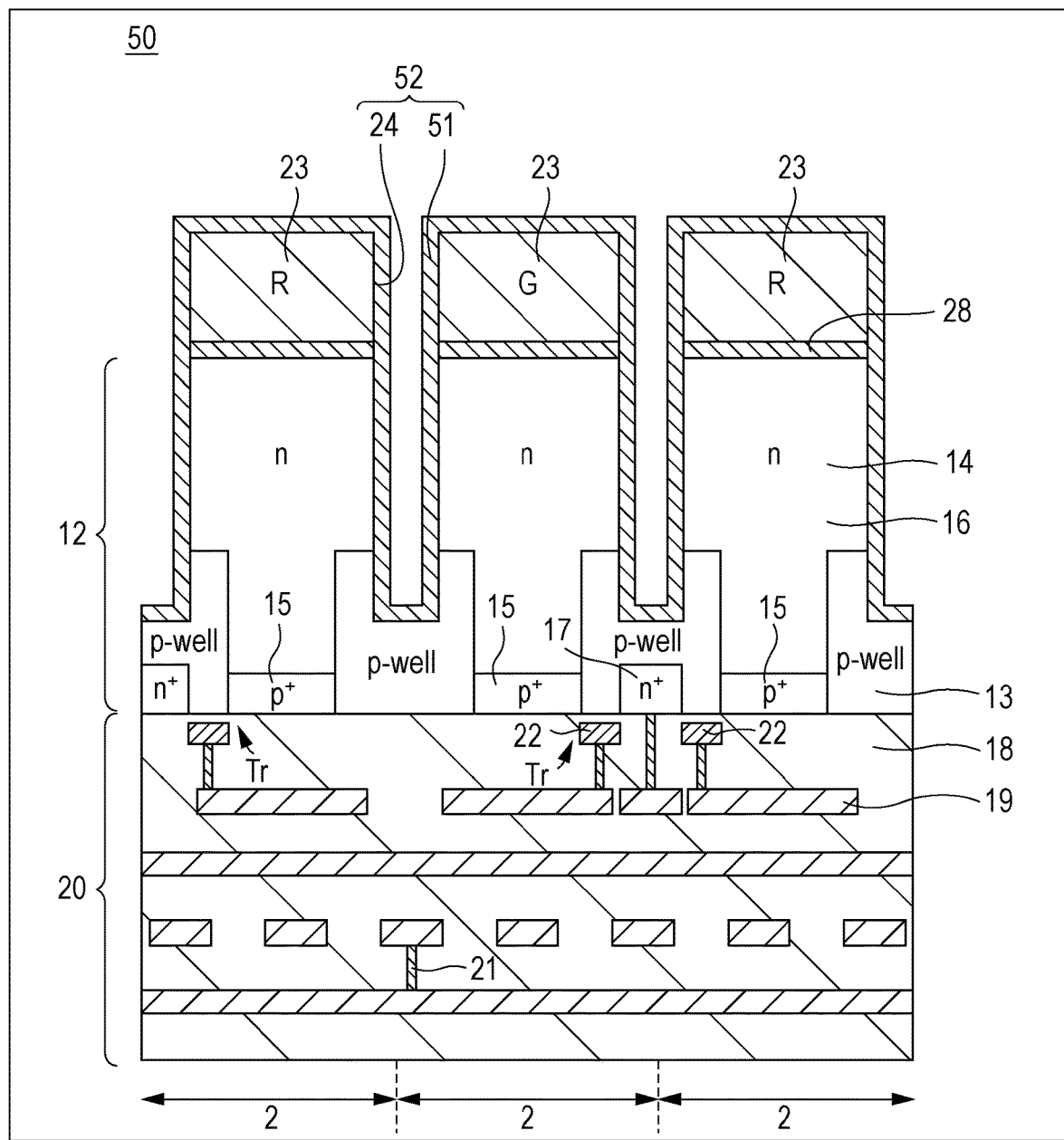
FIG. 9 is a cross-sectional view of the structure in the pixel region of a solid-state imaging device according to a fourth embodiment of the present disclosure.

4. Fourth Embodiment: (Second) Example Where a Device Isolating Portion is Hollow Next, a solid-state imaging device according to a fourth embodiment of the present disclosure is described. FIG. 9 is a cross-sectional view of the main components of the solid-state imaging device 50 of this embodiment. The solid-state imaging device 50 of this embodiment differs from the solid-state imaging device 40 according to the third embodiment in that the pixel isolating portion is not formed, and an in-groove fixed charge film 51 to cover the inner wall surfaces of the groove portion 24 is provided. Therefore, in FIG. 9, the same components as those shown in FIGS. 2 and 6 are denoted by the same reference numerals as those used in FIGS. 2 and 6, and explanation of them is not repeated herein. Also, the entire structure of the solid-state imaging device 50 of this embodiment is the same as the structure shown in FIG. 1, and therefore, explanation thereof will not be repeated herein.

In the solid-state imaging device 50 of this embodiment, a device isolating portion 52 is formed with the groove portion 24 formed to extend from the surfaces of the color filter layers 23 to the well regions 13 in the substrate 12, and an in-groove fixed charge film 51 provided to cover the groove portion 24. In this embodiment, the in-groove fixed charge film 51 is also formed on the surfaces of the color filter layers 23.

This in-groove fixed charge film 51 is formed so as to cover the inner wall surfaces of the groove portion 24 and the surfaces of the color filter layers 23 after the groove portion 24 is formed in the same manner as in FIG. 7B. In this embodiment, the in-groove fixed charge film 51 is made of a material that has a lower refractive index than the refractive index of the color filter layers 23 and contains negative fixed charges.

In the solid-state imaging device 50 of this embodiment, a pixel isolating portion formed with a p-type semiconductor region is not formed in the substrate 12, but the inner wall surfaces of the groove portion 24 are covered with the in-groove fixed charge film 51. Accordingly, dark current generation in the interfaces of the groove portion 24 can be restrained.

Although the pixel isolating portion formed with a p-type semiconductor region is not provided in the substrate 12 in this embodiment, the pixel isolating portion may be formed, and the groove portion 24 may be formed in the pixel isolating portion as in the third embodiment. In such a case, the hole pinning effect of the in-groove fixed charge film 51 is increased, and generation of dark current can be more effectively restrained. In addition to the above effects, this embodiment can achieve the same effects as those of the first through third embodiments.

5. Fifth Embodiment: Example Where the Color Filter Layers are Made Thicker

Figure 10:
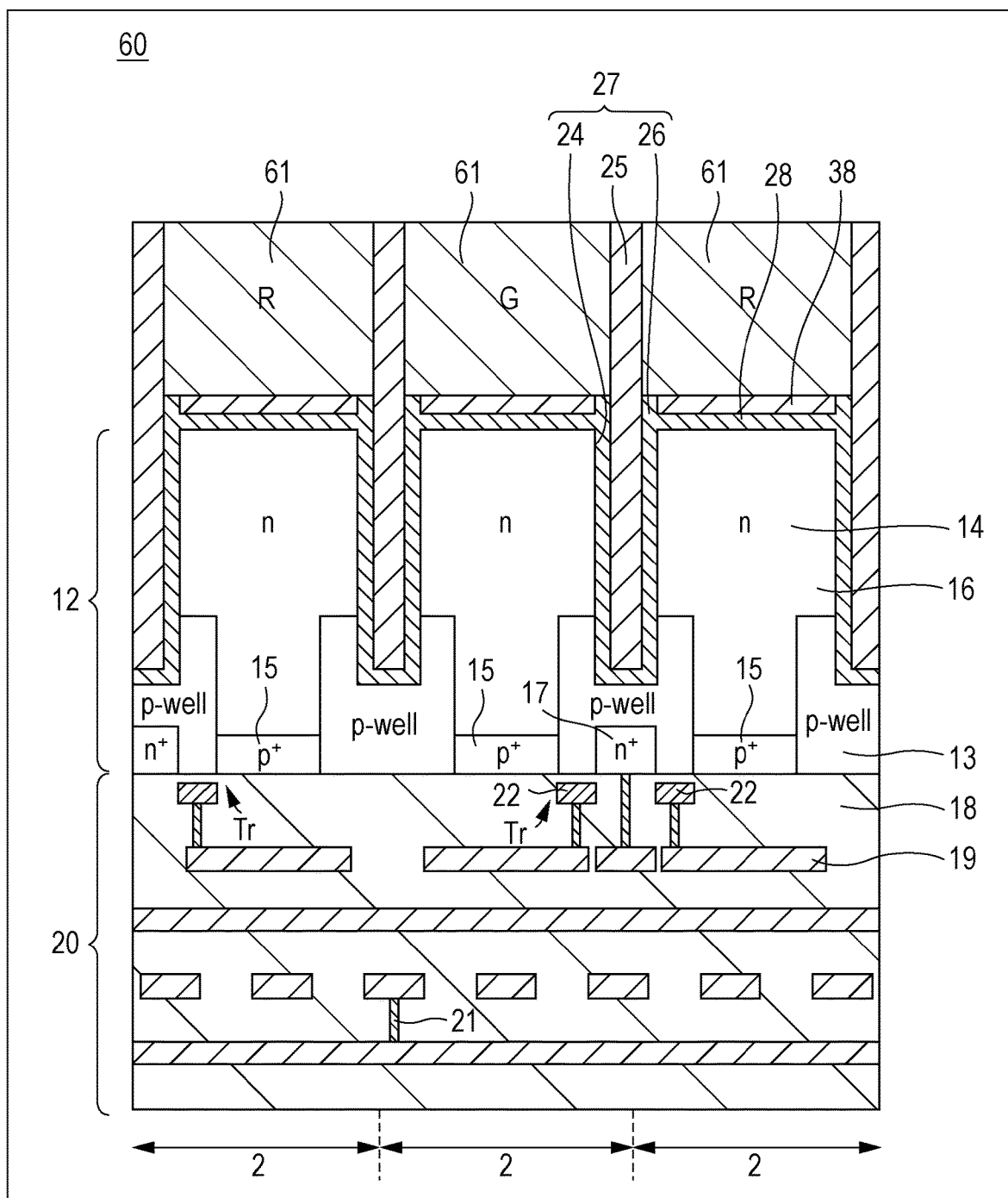
FIG. 10 is a cross-sectional view of the structure in the pixel region of a solid-state imaging device according to a fifth embodiment of the present disclosure.

Next, a solid-state imaging device according to a fifth embodiment of the present disclosure is described. FIG. 10 is a cross-sectional view of the main components of the solid-state imaging device 60 of this embodiment. The solid-state imaging device 60 of this embodiment differs from the first embodiment in the structures of color filter layers 61. Therefore, in FIG. 10, the same components as those shown in FIG. 2 are denoted by the same reference numerals as those used in FIG. 2, and explanation of them is not repeated herein. Also, the entire structure of the solid-state imaging device 60 of this embodiment is the same as the structure shown in FIG. 1, and therefore, explanation thereof will not be repeated herein.

In this embodiment, the thickness of the color filter layers 61 is greater than the thickness of the color filter layers 23 of the solid-state imaging device 1 according to the first embodiment, and is 1 μm or greater. While the thickness of the color filter layers is approximately 500 nm in a conventional solid-state imaging device, the color filter layers 61 in the solid-state imaging device 60 of this embodiment has a thickness of 1 μm or greater, which is much greater than that in a conventional solid-state imaging device.

The pigment concentration in the color filter layers 61 maybe substantially the same as the pigment concentration in the color filter layers 23 in the first embodiment, or may be lower than the pigment concentration in the color filter layers 23 in the first embodiment. As the pigment concentration in the color filter layers 61 is adjusted in this manner, spectral sensitivity can also be adjusted in this embodiment.

In this embodiment, the device isolating portion 27 is formed to extend from the surfaces of the color filter layers 61 to the depth at which the well region 13 are formed in the substrate 12, as in the first embodiment.

The solid-state imaging device 60 of this embodiment can be manufactured by adjusting the thickness of the hard mask 29 to 1 μm or greater in the procedure shown in FIG. 3A in the first embodiment, for example. In the solid-state imaging device 60 of this embodiment, the pixels 2 are also isolated from one another by the device isolating portion 27 in the region extending from the color filter layers 61 to the substrate 12. Accordingly, in the solid-state imaging device 60 of this embodiment, a light collecting tube structure is formed, with the core being the color filter layers 61 and the photoelectric conversion units 16 formed in the substrate 12, the cladding being the device isolating portion 27.

In the solid-state imaging device 60 of this embodiment, the color filter layers 61 are made thicker, so that light that enters the device isolating portion 27 in the light incidence surface is sufficiently absorbed by the color filter layers 61 forming the core, and then enters the photoelectric conversion units 16. Accordingly, spectral characteristics are improved in the solid-state imaging device 60 of this embodiment. With the solid-state imaging device 60 of this embodiment, the same effects as those of the first embodiment can also be achieved.

6. Sixth Embodiment: Example Where a Light Scattering Structure is Provided

Figure 11:
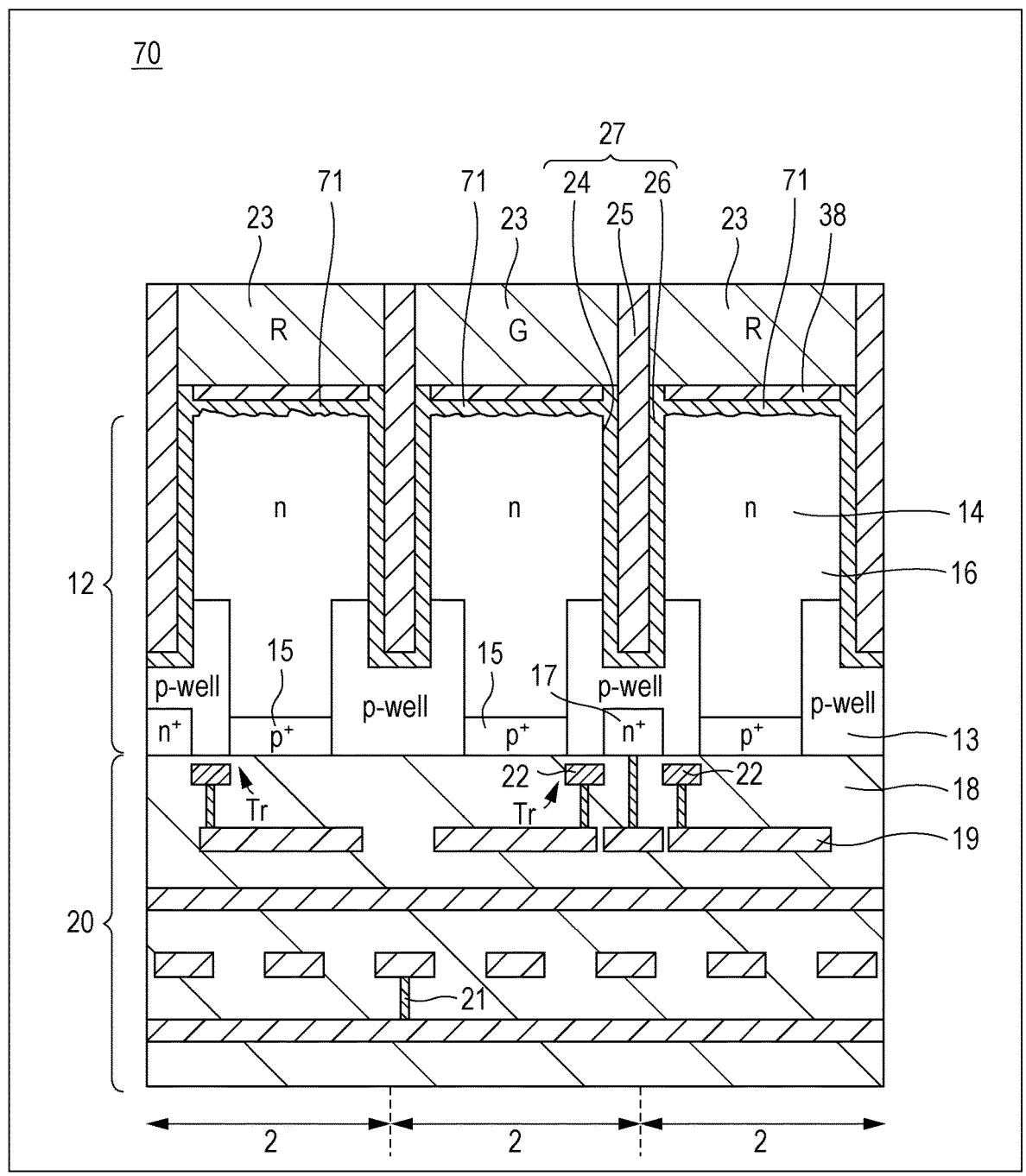
FIG. 11 is a cross-sectional view of the structure in the pixel region of a solid-state imaging device according to a sixth embodiment of the present disclosure.

Next, a solid-state imaging device according to a sixth embodiment of the present disclosure is described. FIG. 11 is a cross-sectional view of the main components of the solid-state imaging device 70 of this embodiment. The solid-state imaging device 70 of this embodiment differs from the solid-state imaging device 1 of the first embodiment in that a corrugated surface 71 is formed in the back surface of the substrate 12 serving as the light incidence surface. Therefore, in FIG. 11, the same components as those shown in FIG. 2 are denoted by the same reference numerals as those used in FIG. 2, and explanation of them is not repeated herein.

In the solid-state imaging device 70 of this embodiment, the back surface of the substrate 12 serving as the light incidence surface is processed to have minute concavities and convexities as shown in FIG. 11, so that the corrugated surface 71 is formed in the back surface of the substrate 12. The corrugated surface 71 formed in the back surface of the substrate 12 is also designed to have such a shape as to increase the incidence angle of incident light. This corrugated surface 71 forms a light scattering structure between the substrate 12 and the color filter layers 23.

In the solid-state imaging device 70 of this embodiment, after the interconnect layer 20 is formed on the surface of the substrate 12, a supporting substrate is bonded to the surface of the interconnect layer 20 on the side of the substrate 12, and the substrate 12 is turned upside down. The corrugated surface 71 is then formed while the substrate 12 is subjected to film thinning treatment. When the substrate 12 is subjected to film thinning treatment, the back surface of the substrate 12 is polished to a predetermined depth by CMP, for example. At this point, with the use of a predetermined abrasive, rough polishing is performed in the film thinning treatment. As a result, the corrugated surface 71 can be formed in the back surface of the substrate 12, as shown in FIG. 11.

As the light incidence surface of the substrate 12 is the corrugated surface 71 in the solid-state imaging device 70 of this embodiment, the incidence angle of incident light becomes greater. In a case where the corrugated surface 71 is designed so that light entering perpendicularly to the light incidence surface of the substrate 12 is bent 45 degrees, for example, the optical path length in the photoelectric conversion units 16 is 1.4 times the optical path length formed in a case where light enters perpendicularly. As the incidence angle of incident light is changed in this manner, the optical path length in the photoelectric conversion units 16 can be increased, and particularly, the sensitivity to long-wavelength light (such as red) can be improved. In addition to the above effects, the same effects as those of the first embodiment can also be achieved with the solid-state imaging device 70 of this embodiment.

Although the back surface of the substrate 12 is the corrugated surface 71 in the solid-state imaging device 70 of this embodiment, the light incidence surfaces of the color filter layers 23 may be corrugated surfaces, and the same effects as those of this embodiment can be achieved if a light scattering structure is formed on the light incidence side of the photoelectric conversion units 16.

As the surface located between the photoelectric conversion units 16 and the color filter layers 23 is the corrugated surface 71 in this embodiment, the incidence angle of incident light that has passed through the color filter layers 23 is increased by the corrugated surface 71 before entering the photoelectric conversion units 16. Accordingly, only the optical path after light enters the photoelectric conversion units 16 can be made longer, without a change in the spectral path of incident light in the color filter layers 23.

The above described corrugated surface 71 effectively increases the optical path length in the photoelectric conversion units 16 in a case where long-wavelength light is photoelectrically converted. Therefore, the corrugated surface 71 may be provided only for the red pixels 2, but the corrugated surface 71 may not be provided for the green and blue pixels.

7. Seventh Embodiment: Example Where a Light Absorbing Portion is Provided

Figure 12:
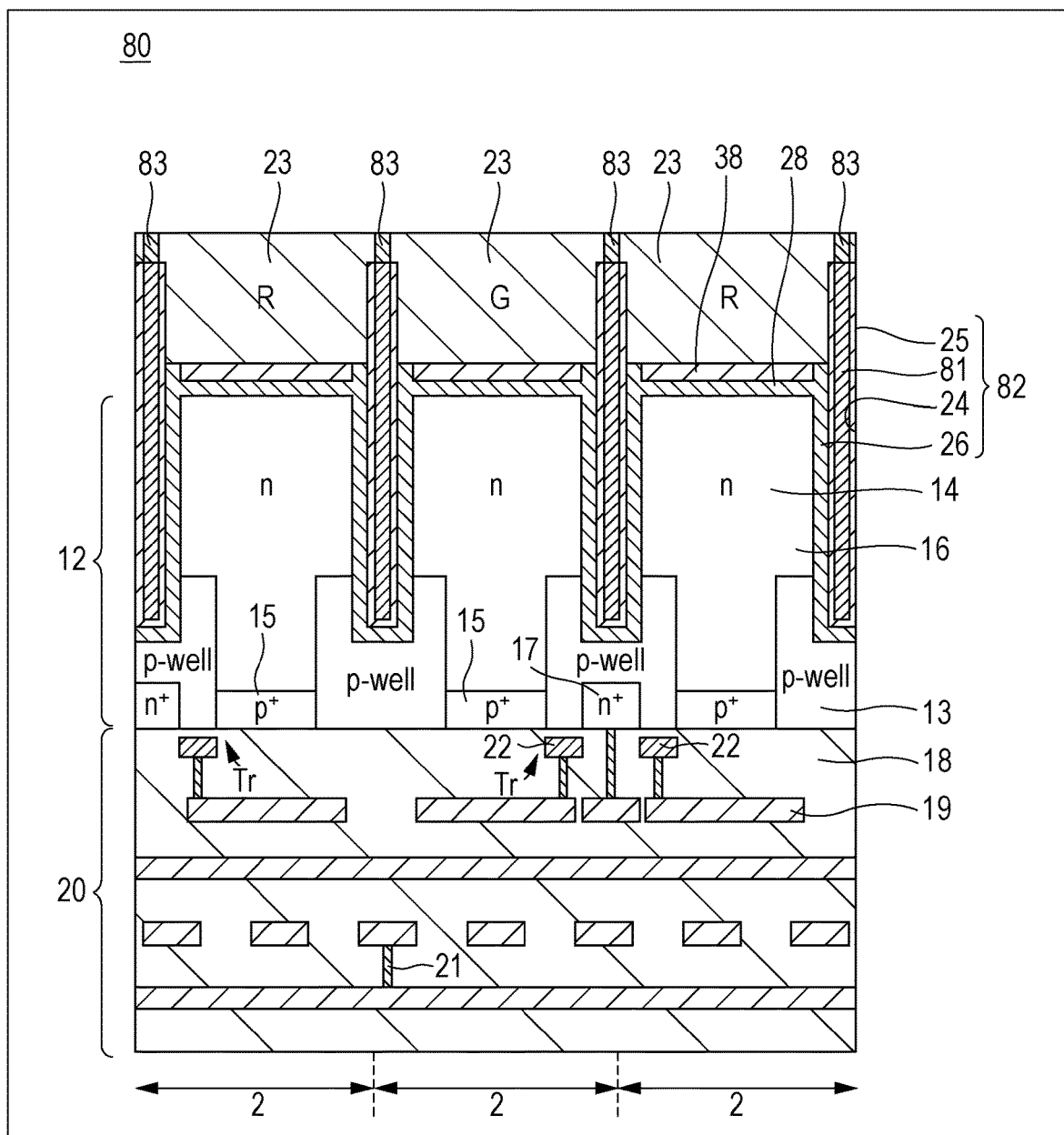
FIG. 12 is a cross-sectional view of the structure in the pixel region of a solid-state imaging device according to a seventh embodiment of the present disclosure.

Next, a solid-state imaging device according to a seventh embodiment of the present disclosure is described. FIG. 12 is a cross-sectional view of the main components of the solid-state imaging device 80 of this embodiment. The solid-state imaging device 80 of this embodiment differs from the solid-state imaging device 1 of the first embodiment in the structure of a device isolating portion 82 and a light absorbing portion 83 formed on the device isolating portion 82. Therefore, in FIG. 12, the same components as those shown in FIG. 2 are denoted by the same reference numerals as those used in FIG. 2, and explanation of them is not repeated herein. Also, the entire structure of the solid-state imaging device 80 of this embodiment is the same as the structure shown in FIG. 1, and therefore, explanation thereof will not be repeated herein.

In the solid-state imaging device 80 of this embodiment, the device isolating portion 82 is formed with the groove portion 24, and the in-groove fixed charge film 26, the insulating film 25, and a nontransparent film 81, which are buried in this order in the groove portion 24. The in-groove fixed charge film 26 is formed so as to cover the inner wall surfaces of the groove portion 24 on the side of the substrate 12, and the insulating film 25 is formed in the groove portion 24 so as to cover the in-groove fixed charge film 26. The insulating film 25 is designed to have such a thickness as not to fill the entire groove portion 24. The nontransparent film 81 is formed so as to fill the groove portion 24 having the in-groove fixed charge film 26 and the insulating film 25 formed therein.

The in-groove fixed charge film 26 and the insulating film 25 can be made of the same material as those of the first embodiment. The nontransparent film 81 can be made of an optically nontransparent metal material such as Al or W.

The device isolating portion 82 can be formed by forming the in-groove fixed charge film 26 and the insulating film 25, etching a middle region in the insulating film 25, and filling the formed groove with a desired metal material, as in the procedures in the first embodiment shown in FIGS. 3A through 4E.

The light absorbing portion 83 is formed on the device isolating portion 82, and is made of polysilicon or a light absorbing material such as a chalcopyrite-based material.

This light absorbing portion 83 can be formed by forming a light absorbing material layer on the entire surface including the device isolating portion 82 after the formation of the device isolating portion 82, and performing etching by a photolithography technique in such a manner that the light absorbing material layer remains only on the device isolating portion 82. After the light absorbing portion 83 made of a light absorbing material is formed on the device isolating portion 82, the color filter layers 23 are formed in the same manner as in the procedure shown in FIG. 4F, and the solid-state imaging device 80 of this embodiment is completed.

In this embodiment, the light incidence surfaces of the color filter layers 23 are substantially level with the surface of the light absorbing portion 83, or are closer to the substrate 12 than the surface of the light absorbing portion 83 is.

As the light absorbing portion 83 is formed on the light incidence surface side of the device isolating portion 82 in the solid-state imaging device 80 of this embodiment, the amount of light that enters the device isolating portion 82 can be reduced. Accordingly, the spectral characteristics in the color filter layers 23 can be improved.

Furthermore, in the solid-state imaging device 80 of this embodiment, the nontransparent film 81 made of a metal material is provided in the groove portion 24 in the device isolating portion 82. With this arrangement, the spectral characteristics between adjacent pixels 2 can be further improved, and color mixing can be further reduced accordingly. In addition to the above effects, this embodiment can achieve the same effects as those of the first embodiment.

In the solid-state imaging device 80 of this embodiment, a predetermined potential may be applied to the nontransparent film 81 made of a metal material. As a negative potential is applied to the nontransparent film 81, for example, holes are generated in the inner wall surfaces of the groove portion 24 in the substrate 12, and accordingly, the effect to reduce dark current can be increased.

Figure 13:
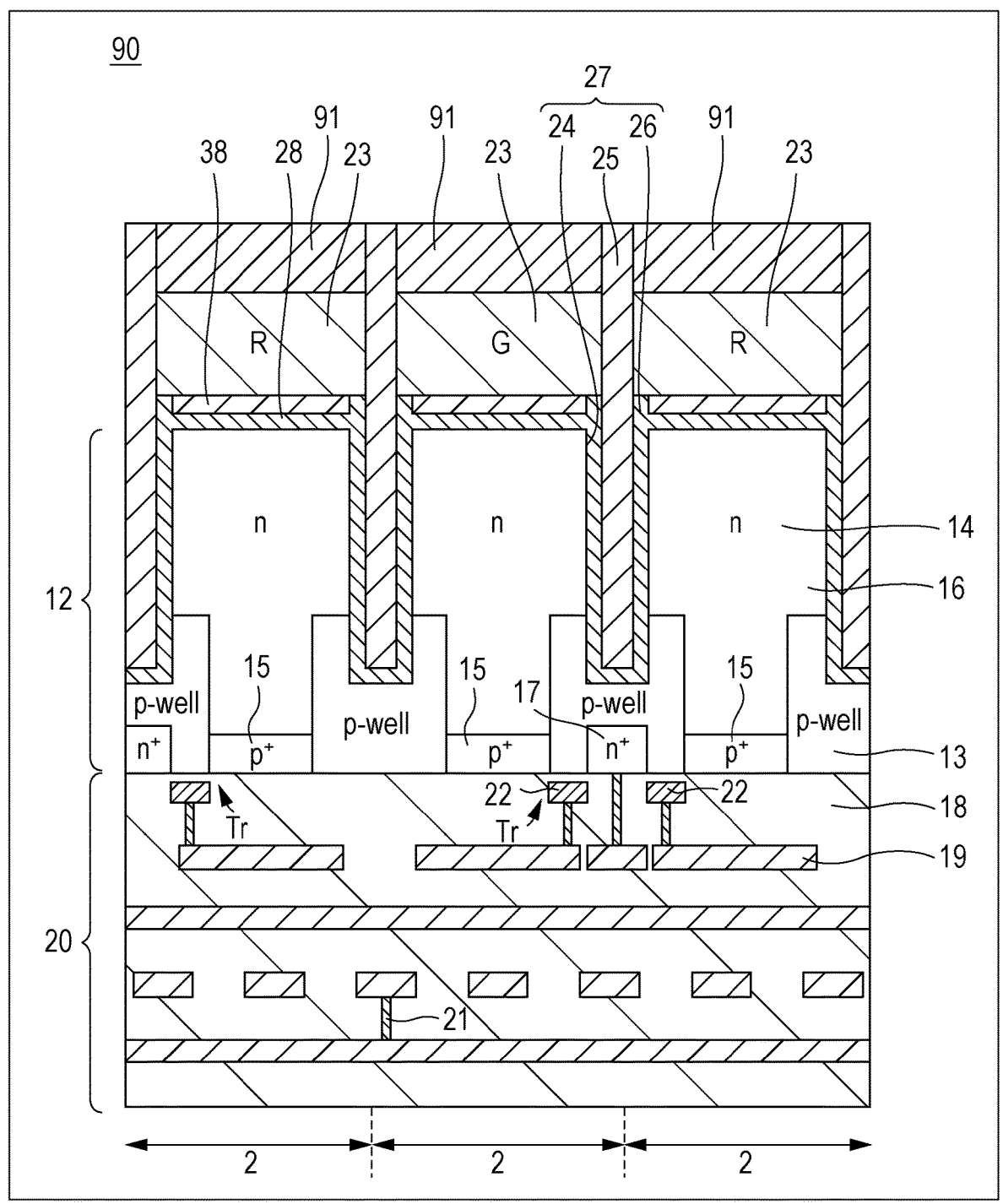
FIG. 13 is a cross-sectional view of the structure in the pixel region of a solid-state imaging device according to an eighth embodiment of the present disclosure.

8. Eighth Embodiment: (First) Example Where High-Refractive Material Portions are Provided Next, a solid-state imaging device according to an eighth embodiment of the present disclosure is described. FIG. 13 is a cross-sectional view of the main components of the solid-state imaging device 90 of this embodiment. The solid-state imaging device 90 of this embodiment differs from the solid-state imaging device 1 of the first embodiment in that high-refractive material portions 91 are formed on the color filter layers 23. Therefore, in FIG. 13, the same components as those shown in FIG. 2 are denoted by the same reference numerals as those used in FIG. 2, and explanation of them is not repeated herein. Also, the entire structure of the solid-state imaging device 90 of this embodiment is the same as the structure shown in FIG. 1, and therefore, explanation thereof will not be repeated herein.

In the solid-state imaging device 90 of this embodiment, the high-refractive material portions 91 made of a material having a higher refractive index than the device isolating portion 27 are formed on the color filter layers 23. The high-refractive material portions 91 can be formed with a lens material, for example. The thickness of the high-refractive material portions 91 may be several hundreds of nanometers, and may be approximately equal to the width of the device isolating portion 27 in the direction parallel to the planar direction of the substrate 12, for example.

The device isolating portion 27 is formed to extend from the light incidence surfaces of the high-refractive material portions 91 to the depth of the well regions 13 in the substrate 12. That is, in this embodiment, the high-refractive material portions 91 are isolated from one another by the device isolating portion 27 between adjacent pixels 2.

In a case where the high-refractive material portions 91 shown in FIG. 13 are formed, the color filter layers 23 are first formed in the same manner as in the procedures of the first embodiment shown in FIGS. 3A through 4F, and the color filter layers 23 are partially removed so that the surfaces of the color filter layers 23 become closer to the substrate 12 than the surface of the device isolating portion 27 is. After that, a lens material is applied onto the color filter layers, to complete the solid-state imaging device 90 shown in FIG. 13.

In the solid-state imaging device 90 of this embodiment, the pixels 2 are isolated from one another by the device isolating portion 27 in the region extending from the high-refractive material portions 91 to the substrate 12. Accordingly, in the solid-state imaging device 90 of this embodiment, a light collecting tube structure is formed, with the core being the high-refractive material portions 91, the color filter layers 23, and the photoelectric conversion units 16 formed in the substrate 12, the cladding being the device isolating portion 27.

In the solid-state imaging device 90 of this embodiment, the distance from the light incidence surface to the substrate is longer, because the high-refractive material portions 91 are provided. Therefore, light that enters the device isolating portion 27 is sufficiently absorbed by the color filter layers 23 forming the core, and then enters the photoelectric conversion units 16. Accordingly, spectral characteristics are improved in the solid-state imaging device 90 of this embodiment. With the solid-state imaging device 90 of this embodiment, the same effects as those of the first embodiment can also be achieved.

Figure 14:
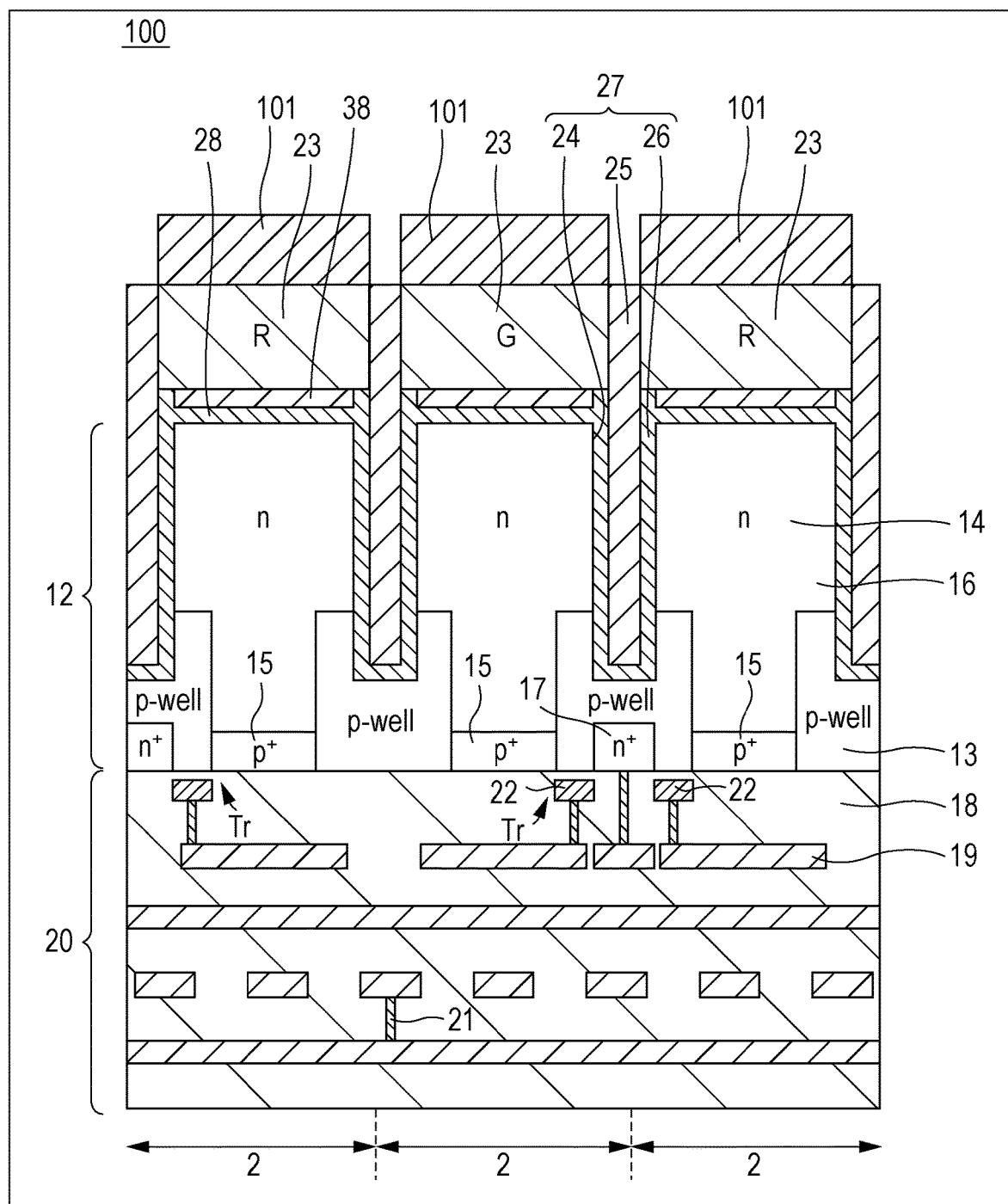
FIG. 14 is a cross-sectional view of the structure in the pixel region of a solid-state imaging device according to a ninth embodiment of the present disclosure.

9. Ninth Embodiment: (Second) Example Where High-Refractive Material Portions are Provided Next, a solid-state imaging device according to a ninth embodiment of the present disclosure is described. FIG. 14 is a cross-sectional view of the main components of the solid-state imaging device 100 of this embodiment. The solid-state imaging device 100 of this embodiment differs from the solid-state imaging device 1 of the first embodiment in that high-refractive material portions 101 each having a rectangular shape in cross-section are formed on the color filter layers 23. Therefore, in FIG. 14, the same components as those shown in FIG. 2 are denoted by the same reference numerals as those used in FIG. 2, and explanation of them is not repeated herein. Also, the entire structure of the solid-state imaging device 100 of this embodiment is the same as the structure shown in FIG. 1, and therefore, explanation thereof will not be repeated herein.

In the solid-state imaging device 100 of this embodiment, the high-refractive material portions 101 formed on the color filter layers 23 each have a rectangular shape in cross-section, and are provided for the respective pixels 2. Adjacent high-refractive material portions 101 are isolated from each other by a groove portion 101a. The material of the high-refractive material portions 101 may be the same material as the lens material used in conventional solid-state imaging devices.

In the solid-state imaging device 100 of this embodiment, a light collecting tube structure is formed, with the core being the high-refractive material portions 101, the color filter layers 23, and the photoelectric conversion units 16, the cladding being the groove portion 101a between the adjacent high-refractive material portions 101 and the device isolating portion 27. Accordingly, with the solid-state imaging device 1 of this embodiment, the same effects as those of the eighth embodiment can also be achieved.

10. Tenth Embodiment: Example Where On-Chip Lenses are Provided

Figure 15:
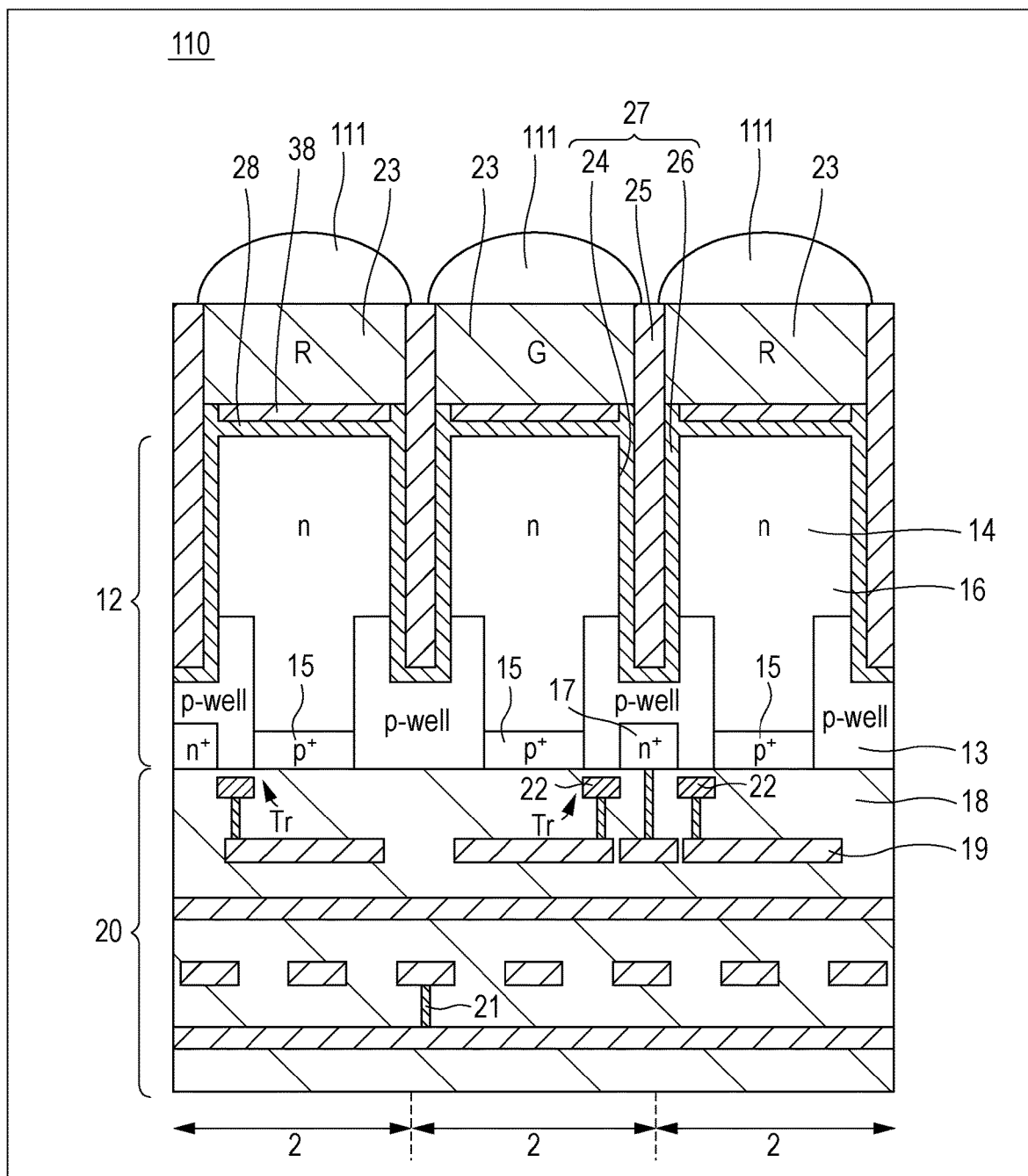
FIG. 15 is a cross-sectional view of the structure in the pixel region of a solid-state imaging device according to a tenth embodiment of the present disclosure.

Next, a solid-state imaging device according to a tenth embodiment of the present disclosure is described. FIG. 15 is a cross-sectional view of the main components of the solid-state imaging device 110 of this embodiment. The solid-state imaging device 110 of this embodiment differs from the solid-state imaging device 1 of the first embodiment in that on-chip lenses 111 are provided on the color filter layers 23. Therefore, in FIG. 15, the same components as those shown in FIG. 2 are denoted by the same reference numerals as those used in FIG. 2, and explanation of them is not repeated herein. Also, the entire structure of the solid-state imaging device 110 of this embodiment is the same as the structure shown in FIG. 1, and therefore, explanation thereof will not be repeated herein.

In the solid-state imaging device 110 of this embodiment, the on-chip lenses 111 provided on the color filter layers 23 are designed to have spherical surfaces so that incident light is gathered into each corresponding pixel 2. The on-chip lenses 111 can be formed by the same method as the method of manufacturing on-chip lenses of conventional solid-state imaging devices, after the color filter layers 23 are formed in the same manner as in the procedures of the first embodiment shown in FIGS. 3A through 4F.

In the solid-state imaging device 110 of this embodiment, incident light can be gathered into each corresponding pixel 2, because the on-chip lenses 111 are provided. Accordingly, light collection efficiency can be improved, and sensitivity can be increased. In addition to the above effects, the same effects as those of the first embodiment can be achieved.

In the above described first through tenth embodiments, the first conductivity type is the n-type, the second conductivity type is the p-type, and electrons are used as signal charges. However, the present disclosure can also be applied in cases where holes are used as signal charges. In such cases, the conductivity types in each of the embodiments should be reversed. Solid-state imaging devices of the present disclosure are not limited to the above described first through tenth embodiments, and various combinations are possible without departing from the scope of the present disclosure.

The present disclosure is not necessarily applied to a solid-state imaging device that senses a distribution of visible incident light and captures the distribution as an image, but may also be applied to a solid-state imaging device that captures a distribution of infrared rays or X-rays or the like as an image.

Furthermore, the present disclosure is not limited to solid-state imaging devices that sequentially scan respective unit pixels in the pixel region by the row, and read pixel signals from the respective unit pixels. The present disclosure can also be applied to a solid-state imaging device of an X-Y address type that selects desired pixels one by one, and reads signals from the selected pixels one by one. A solid-state imaging device may be in the form of a single chip, or may be in the form of a module that is formed by packaging a pixel unit and a signal processing unit or an optical system, and has an imaging function.

A solid-state imaging device of the present disclosure can be used in an imaging apparatus. Here, an imaging apparatus is a camera system such as a digital still camera or a digital video camera, or an electronic apparatus that has an imaging function such as a portable telephone device. The form of the above described module mounted on an electronic apparatus, or a camera module, is an imaging apparatus in some cases.

11. Eleventh Embodiment: Electronic Apparatus

Figure 16:
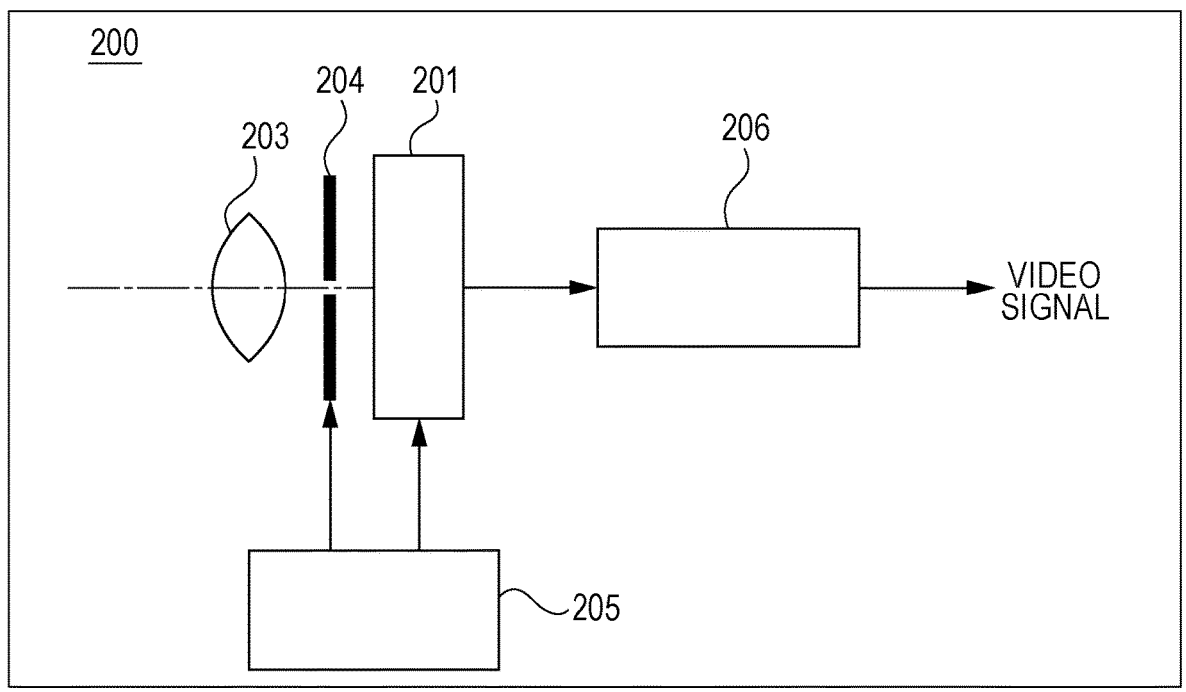
FIG. 16 is a schematic view of the structure of an electronic apparatus according to an eleventh embodiment of the present disclosure.

Next, an electronic apparatus according to an eleventh embodiment of the present disclosure is described. FIG. 16 is a schematic view of the structure of the electronic apparatus 200 according to the eleventh embodiment of the present disclosure.

The electronic apparatus 200 according to this embodiment includes a solid-state imaging device 201, an optical lens 203, a shutter device 204, a drive circuit 205, and a signal processing circuit 206. The electronic apparatus 200 of this embodiment represents an embodiment in which the solid-state imaging device 1 of the above described first embodiment of the present disclosure is used as the solid-state imaging device 201 in an electronic apparatus (a digital still camera).

The optical lens 203 gathers image light (incident light) from an object and forms an image on the imaging surface of the solid-state imaging device 201. With this, the signal charges are stored in the solid-state imaging device 201 for a certain period of time. The shutter device 204 controls the light exposure period and the light shielding period for the solid-state imaging device 201. The drive circuit 205 supplies drive signals for controlling signal transfer operation of the solid-state imaging device 201 and shutter operation of the shutter device 204. In accordance with a drive signal (a timing signal) supplied from the drive circuit 205, the solid-state imaging device 201 performs signal transfer. The signal processing circuit 206 performs various kinds of signal processing on signals output from the solid-state imaging device 201. Video signals subjected to the signal processing are stored into a storage medium such as a memory, or are output to a monitor.

In the electronic apparatus 200 of this embodiment, light collection characteristics and sensitivity are improved in the solid-state imaging device 201, and image quality can be improved accordingly. Although the solid-state imaging device 1 of the first embodiment is used as the solid-state imaging device 201 in this embodiment, it is also possible to use any of the solid-state imaging devices according to the second through tenth embodiments.

The present disclosure can also be embodied in the structures described below.

(1)

A solid-state imaging device including:
a substrate;
pixels each including a photoelectric conversion unit formed in the substrate;
a color filter layer provided on the light incidence surface side of the substrate; and
a device isolating portion that is formed to divide the color filter layer and the substrate for the respective pixels, and has a lower refractive index than the color filter layer and the substrate.

(2)

The solid-state imaging device of (1), wherein the device isolating portion includes a groove portion formed to extend from the color filter layer to the substrate, and an insulating film that is buried in the groove portion and is made of a material having a lower refractive index than the color filter layer and the substrate.

(3)

The solid-state imaging device of (2), wherein the device isolating portion further includes a film between the inner wall surface of the groove portion and the insulating film, the film being formed to cover the inner wall surface of the groove portion, the film containing fixed charges of the opposite polarity to the polarity of signal charges stored in the photoelectric conversion units, the film being made of a material having a lower refractive index than the color filter layer and the substrate.

(4)

The solid-state imaging device of any one of (1) through (3), wherein the device isolating portion protrudes from the light incidence surface of the color filter layer.

(5)

The solid-state imaging device of any one of (1) through (4), further including a high-refractive material portion formed on the color filter layer, the high-refractive material portion being made of a material having a higher refractive index than the refractive index of the color filter layer, the high-refractive material portion being divided for the respective pixels.

(6)

The solid-state imaging device of any one of (1) through (5), wherein the device isolating portion is placed in the region of the pixel isolating portion formed to divide the substrate for the respective pixels.

(7)

The solid-state imaging device of any one of (1) through (6), further including a light scattering structure on the light incidence surface side of the photoelectric conversion units.

(8)

The solid-state imaging device of any one of (1) through (7), wherein the color filter layer has a thickness of 1 µm or greater.

(9)

The solid-state imaging device of any one of (2) through (8), wherein a metal material is buried in the groove portion via the insulating film.

(10)

The solid-state imaging device of (9), wherein the metal material serves as a nontransparent film.

(11)

The solid-state imaging device of any one of (1) through (10), wherein a light absorbing portion is formed on the light incidence surface side of the device isolating portion.

(12)

The solid-state imaging device of any one of (1) through (11), wherein an on-chip lens is formed on the color filter layer.

(13)

The solid-state imaging device of (1), wherein the device isolating portion is formed with a groove portion extending from the color filter layer to the substrate.

(14)
The solid-state imaging device of any one of (1) through (13), further including a film formed to cover the inner wall surface of the groove portion, the film containing negative fixed charges, the film being made of a material having a lower refractive index than the color filter layer and the substrate.

(15)
A method of manufacturing a solid-state imaging device, including:
the step of forming photoelectric conversion units in a substrate, the photoelectric conversion units corresponding to respective pixels;
the step of forming a color filter layer on the light incidence surface side of the substrate; and
the step of forming a device isolating portion in the region to divide the color filter layer and the substrate for the respective pixels, the device isolating portion having a lower refractive index than the color filter layer and the substrate, the device isolating portion being formed prior to or after the formation of the color filter layer.

(16)
The method of (15), wherein the device isolating portion dividing the color filter layer for the respective pixels and the device isolating portion dividing the substrate for the respective pixels are formed in the same step.

(17)
The method of (15) or (16), wherein
the step of forming the device isolating portion includes:
the step of forming a groove portion, prior to the formation of the color filter layer, by forming a mask on the light incidence surface side of the substrate and performing etching on the substrate via the mask, the mask having an opening in the portion corresponding to the region in which the device isolating portion is to be formed;
the step of forming an insulating film in the groove portion formed in the substrate and the opening of the mask; and
the step of removing the mask, and
the color filter layer is formed in a concave portion after the mask is removed, the concave portion being formed by the substrate and the insulating film designed to protrude from the substrate.

(18)
The method of (15) or (16), wherein the step of forming the device isolating portion includes the step of forming a groove portion, after the formation of the color filter layer, by forming a mask on the color filter layer and performing etching on the color filter layer and the substrate via the mask, the mask having an opening in the portion corresponding to the region in which the device isolating portion is to be formed.

(19)
The method of (15) or (16), wherein the step of forming the device isolating portion includes the step of performing etching on the substrate after the formation of the color filter layer, the mask being the color filter layer divided for the respective pixels and being isolated between adjacent pixels.

(20)
An electronic apparatus including:
a solid-state imaging device; and
a signal processing circuit that processes an output signal that is output from the solid-state imaging device,
the solid-state imaging device including: a substrate; pixels each including a photoelectric conversion unit formed in the substrate; a color filter layer provided on the light incidence surface side of the substrate; and a device isolating portion that is formed to divide the color filter layer and the substrate for the respective pixels, and has a lower refractive index than the color filter layer and the substrate.

REFERENCE SIGNS LIST 1, 30, 40, 50, 60, 70, 80, 90, 100, 110 Solid-state imaging device
2 Pixel
3 Pixel region
4 Vertical drive circuit
5 Column signal processing circuit
6 Horizontal drive circuit
7 Output circuit
8 Control circuit
9 Vertical signal line
10 Horizontal signal line
11, 12 Substrate
13 Well region
14 N-type semiconductor region
15 P-type semiconductor region
16, 32 Photoelectric conversion unit
17 Source/drain region
18 Interlayer insulating film
19 Interconnect
20 Interconnect layer
21 Connection via
22 Gate electrode
23, 61 Color filter layer
23a, 29a Opening
24 Groove portion
25 Insulating film
26, 26a In-groove fixed charge film
27, 33, 43, 52, 82 Device isolating portion
28 Back-surface-side fixed charge film
29, 44 Hard mask
31 P-type semiconductor region
34 Pixel isolating portion
71 Corrugated surface
81 Nontransparent film
83 Light absorbing portion
91, 101 High-refractive material portion
111 On-chip lens
200 Electronic apparatus
201 Solid-state imaging device
203 Optical lens
204 Shutter device
205 Drive circuit
206 Signal processing circuit

What is claimed is:
1. An imaging device comprising:
a semiconductor substrate;
a first photoelectric conversion region disposed in the semiconductor substrate;
a second photoelectric conversion region disposed in the semiconductor substrate adjacent to the first photoelectric conversion region;
a first color filter disposed over the first photoelectric conversion region;
a second color filter disposed over the second photoelectric conversion region;
a groove portion disposed in the semiconductor substrate between the first photoelectric conversion region and the second photoelectric conversion region;
a first insulating film disposed in the groove portion; and
a first air gap disposed between the first color filter and the second color filter.

2. The imaging device of claim 1, wherein the groove portion forms a second air gap between the first photoelectric conversion region and the second photoelectric conversion region.

3. The imaging device of claim 2, wherein the second air gap is disposed at an inner side of the first insulating film in the groove portion.

4. The imaging device of claim 2, wherein the first insulating film is disposed on two sides of the groove portion in a cross-sectional view.

5. The imaging device of claim 4, wherein the second air gap is disposed between the two sides of the first insulating film in the groove portion in the cross-sectional view.

6. The imaging device of claim 2, further comprising:
a second insulating film disposed between the first air gap and the first color filter.

7. The imaging device of claim 6, wherein the second insulating film contacts the first color filter.

8. The imaging device of claim 6, further comprising:
a third insulating film disposed above the first photoelectric conversion region.

9. The imaging device of claim 8, wherein the first insulating film includes a fixed charge film.

10. The imaging device of claim 8, wherein the third insulating film includes a fixed charge film.

11. The imaging device of claim 8, wherein the first insulating film and the third insulating film include a same material.

12. An electronic apparatus, comprising:
a signal processing circuit; and
an imaging device including:
a semiconductor substrate;
a first photoelectric conversion region disposed in the semiconductor substrate;
a second photoelectric conversion region disposed in the semiconductor substrate adjacent to the first photoelectric conversion region;
a first color filter disposed over the first photoelectric conversion region;
a second color filter disposed over the second photoelectric conversion region;
a groove portion disposed in the semiconductor substrate between the first photoelectric conversion region and the second photoelectric conversion region;
a first insulating film disposed in the groove portion; and
a first air gap disposed between the first color filter and the second color filter.

13. The electronic apparatus of claim 12, wherein the groove portion forms a second air gap between the first photoelectric conversion region and the second photoelectric conversion region.

14. The electronic apparatus of claim 13, wherein the second air gap is disposed at an inner side of the first insulating film in the groove portion.

15. The electronic apparatus of claim 13, wherein the first insulating film is disposed on two sides of the groove portion in a cross-sectional view.

16. The electronic apparatus of claim 15, wherein the second air gap is disposed between the two sides of the first insulating film in the groove portion in the cross-sectional view.

17. The electronic apparatus of claim 13, further comprising:
a second insulating film disposed between the first air gap and the first color filter.

18. The electronic apparatus of claim 17, wherein the second insulating film contacts the first color filter.

* * * * *